(12) United States Patent
Lee et al.

(10) Patent No.: US 8,043,897 B2
(45) Date of Patent: Oct. 25, 2011

(54) METHOD FOR FORMING MICRO-ELECTRO-MECHANICAL SYSTEM (MEMS) PACKAGE

(75) Inventors: Chien-Hsing Lee, Hsinchu County (TW); Tsung-Min Hsieh, Taipei County (TW); Chih-Hsiang Lin, Yilan County (TW)

(73) Assignee: Solid State System Co., Ltd., Hsinchu (TW)

( * ) Notice: Subject to any disclaimer, the term of this patent is extended or adjusted under 35 U.S.C. 154(b) by 0 days.

(21) Appl. No.: 13/052,124

(22) Filed: Mar. 21, 2011

(65) Prior Publication Data

US 2011/0165717 A1 Jul. 7, 2011

Related U.S. Application Data

(62) Division of application No. 12/203,151, filed on Sep. 3, 2008.

(51) Int. Cl.
*H01L 21/00* (2006.01)

(52) U.S. Cl. .................. 438/113; 257/416; 257/E21.001
(58) Field of Classification Search .................. 257/416, 257/E29.001, E21.001; 438/113
See application file for complete search history.

(56) References Cited

U.S. PATENT DOCUMENTS

2007/0205492 A1* 9/2007 Wang ........................... 257/659

* cited by examiner

*Primary Examiner* — Trung Q Dang
(74) *Attorney, Agent, or Firm* — Jianq Chyun IP Office

(57) ABSTRACT

A method for forming a micro-electro-mechanical systems (MEMS) package includes following steps. A plurality of MEMS units are formed on a substrate, and each of the MEMS units includes at least a MEMS sensing element and a first chamber over the MEMS sensing element. The MEMS units include electric connection pads. A plurality of covering units are formed correspondingly over the MEMS units. Each of the covering units provides a second chamber over the MEMS sensing element opposite to the first chamber. The covering units are adhered to the MEMS units by an adhesive material. The MEMS units are diced into singulated units.

18 Claims, 34 Drawing Sheets

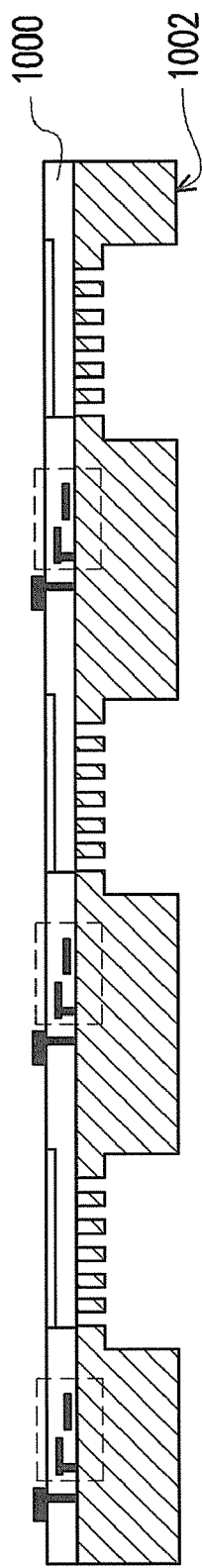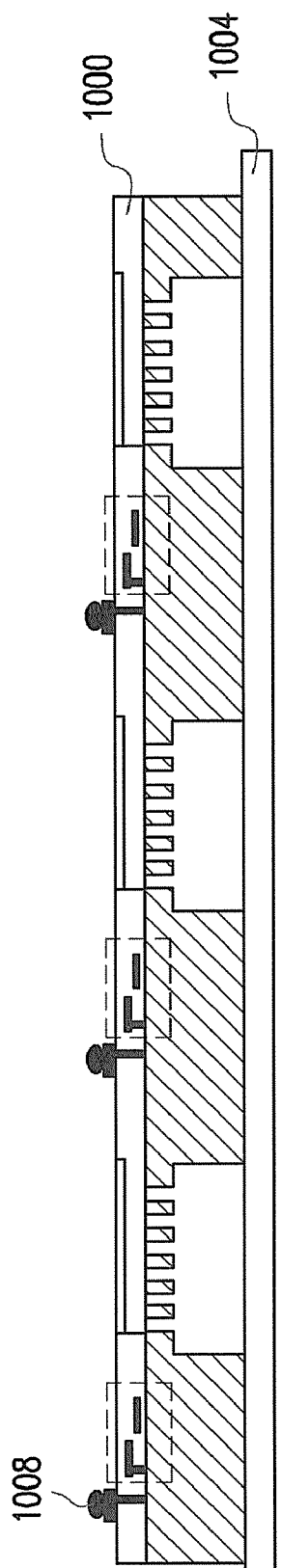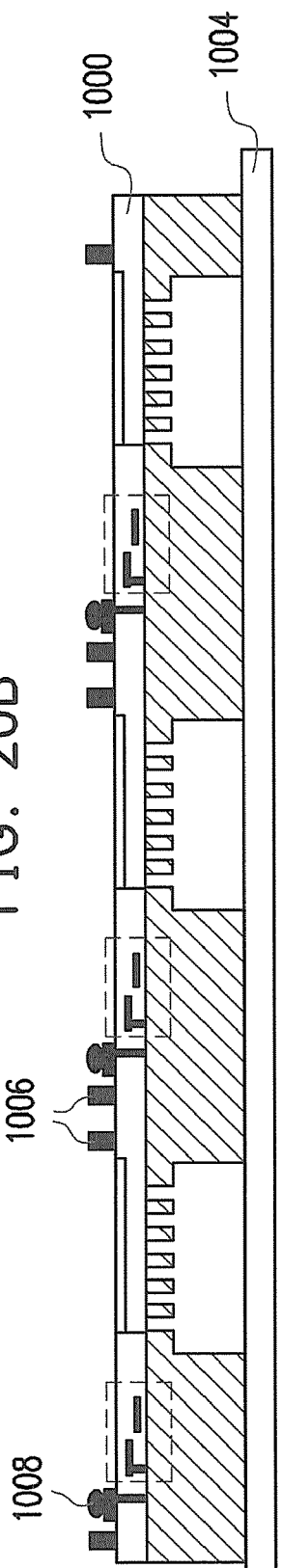

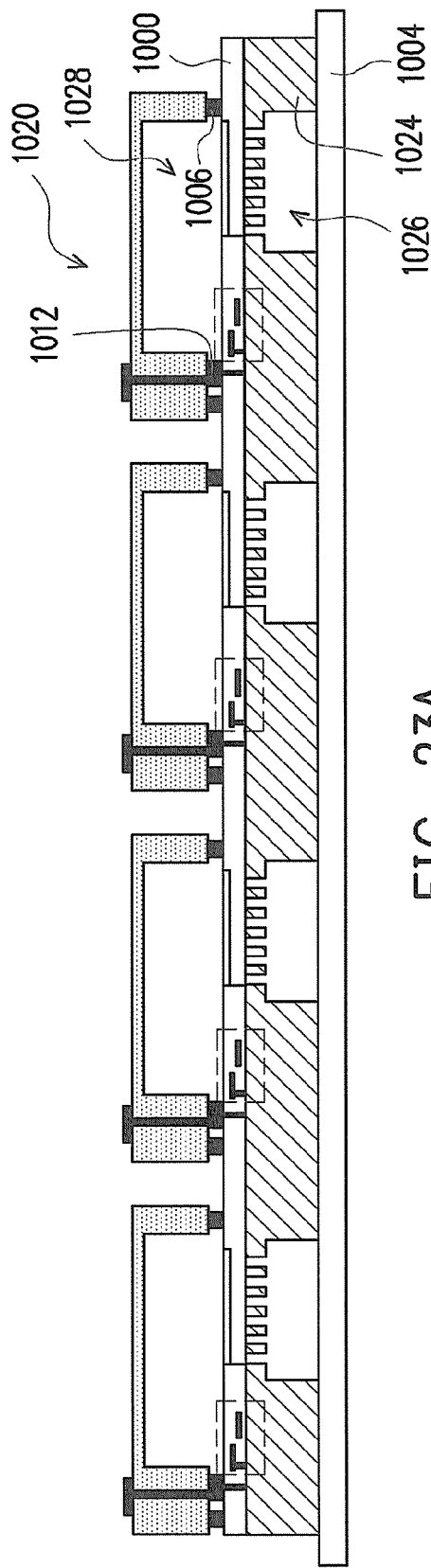
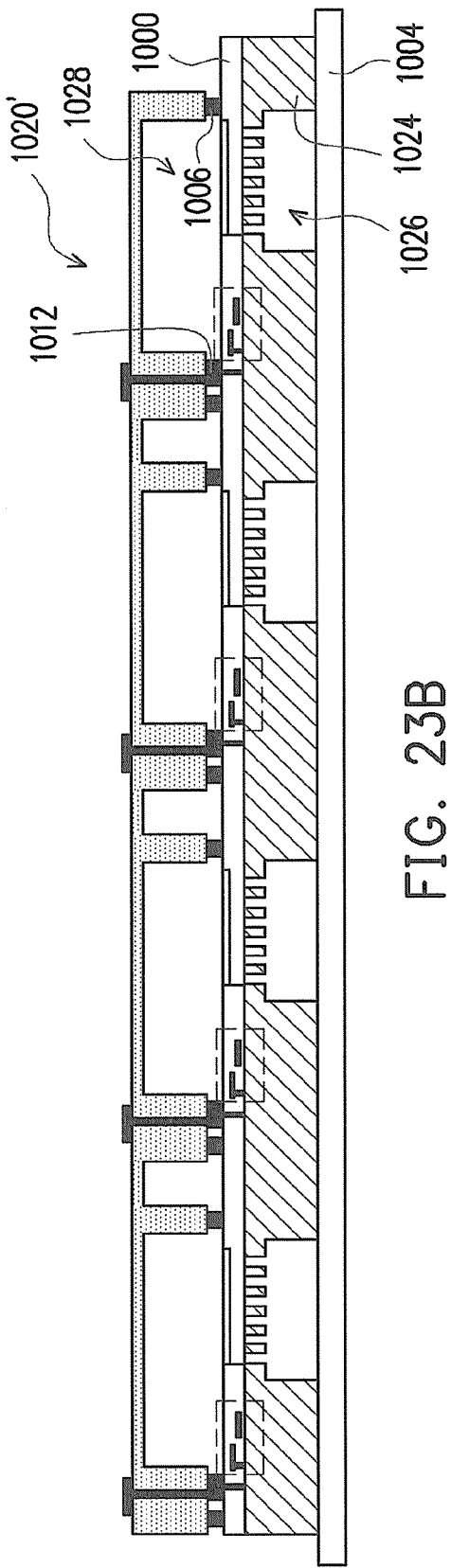
FIG. 23A
FIG. 23B

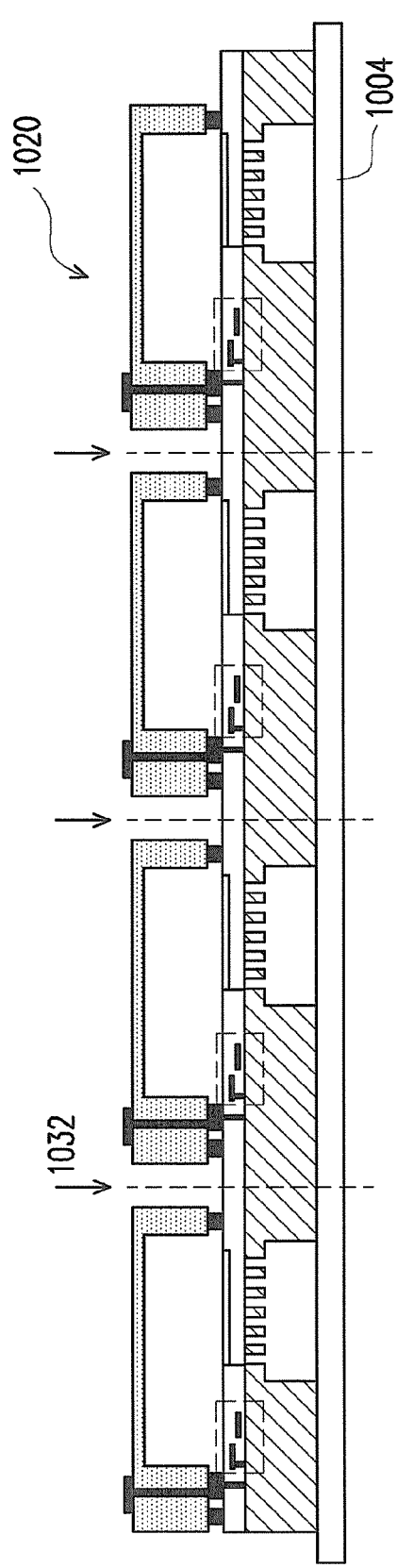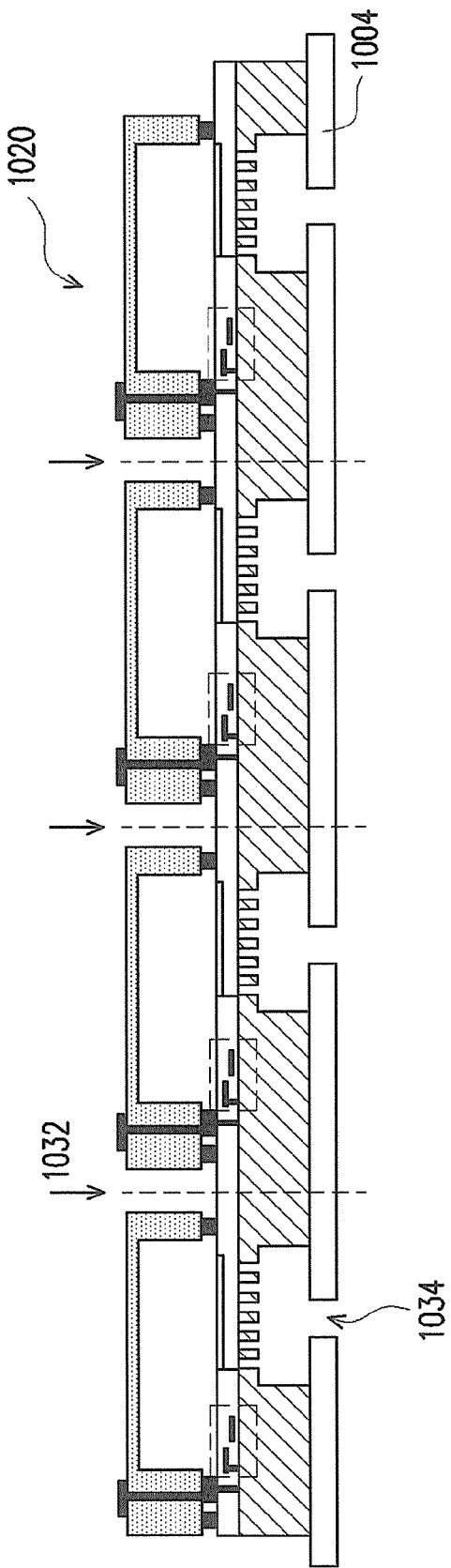
FIG. 25A
FIG. 25B

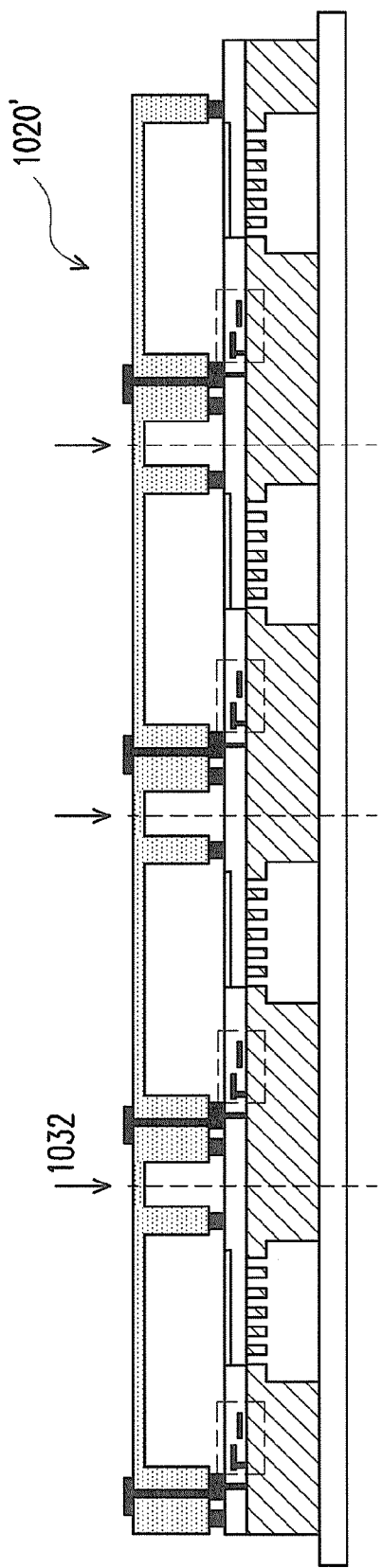
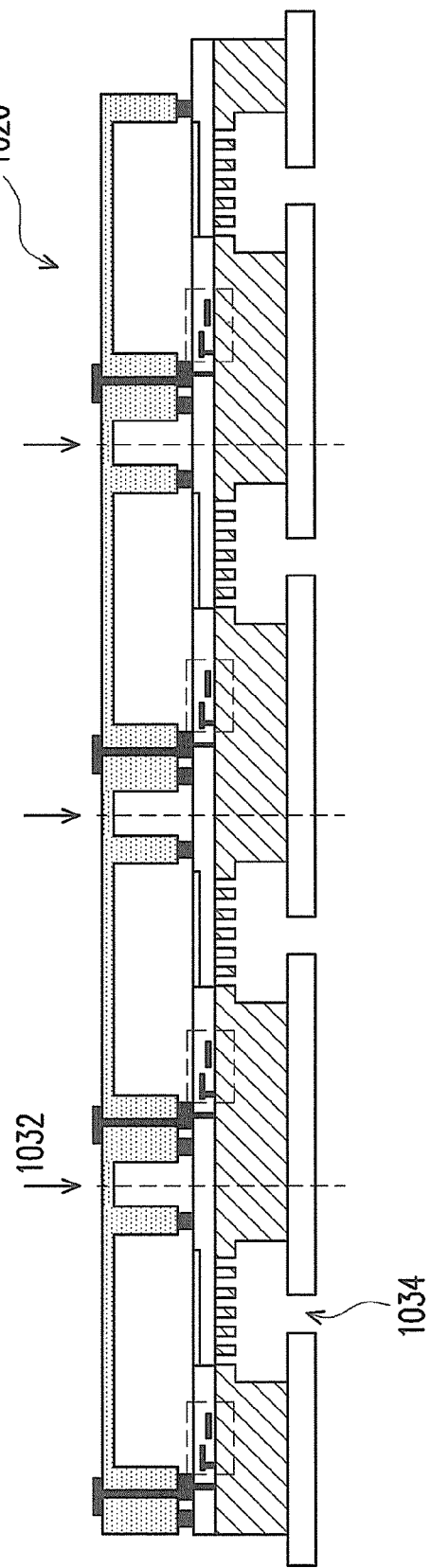
FIG. 26A
FIG. 26B

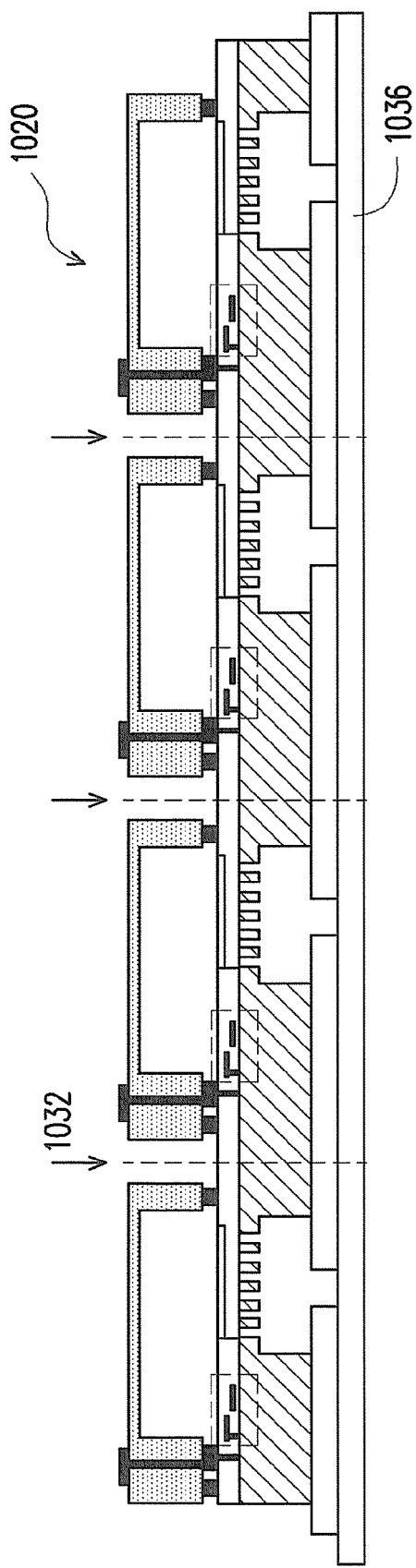
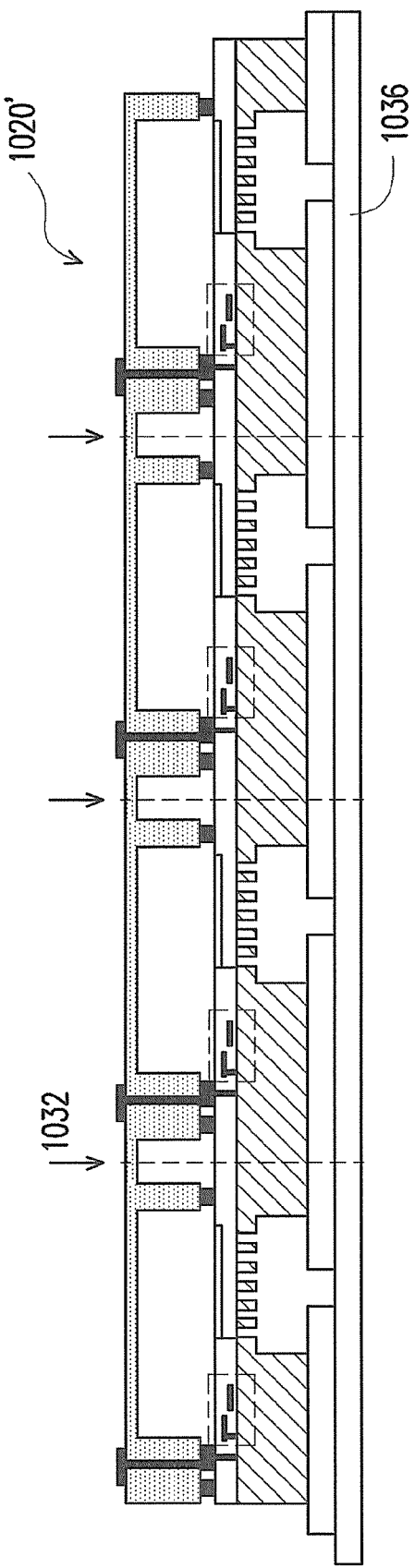
FIG. 27A
FIG. 27B

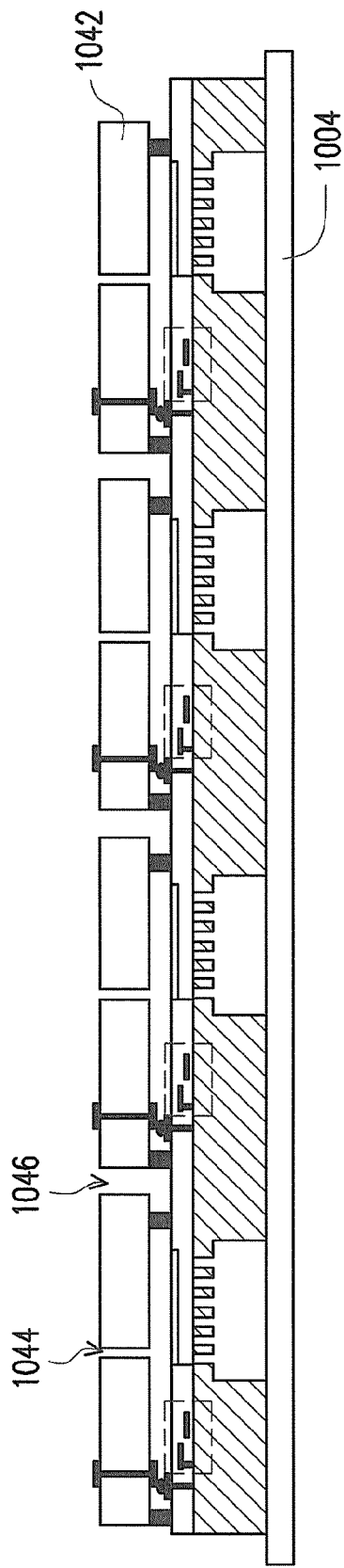
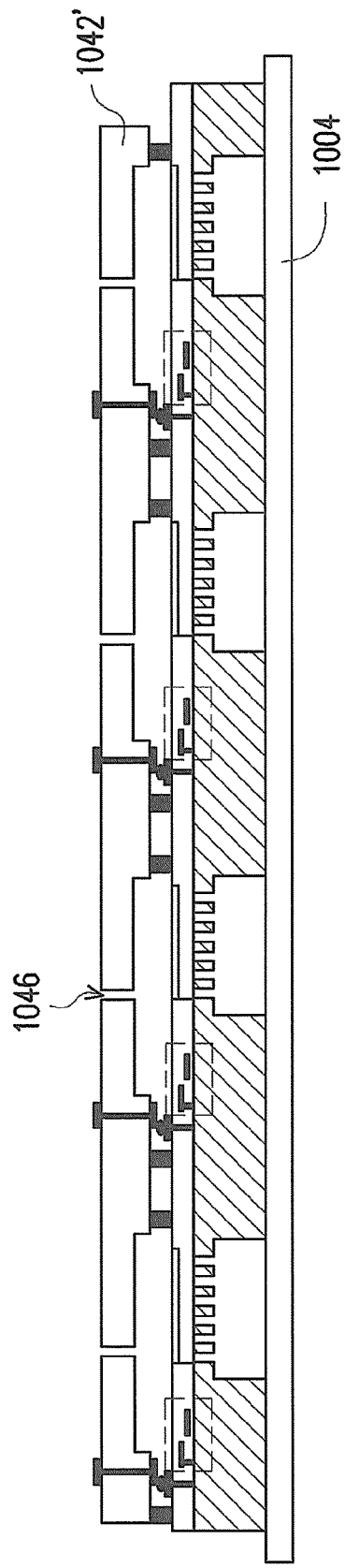
FIG. 29A
FIG. 29B

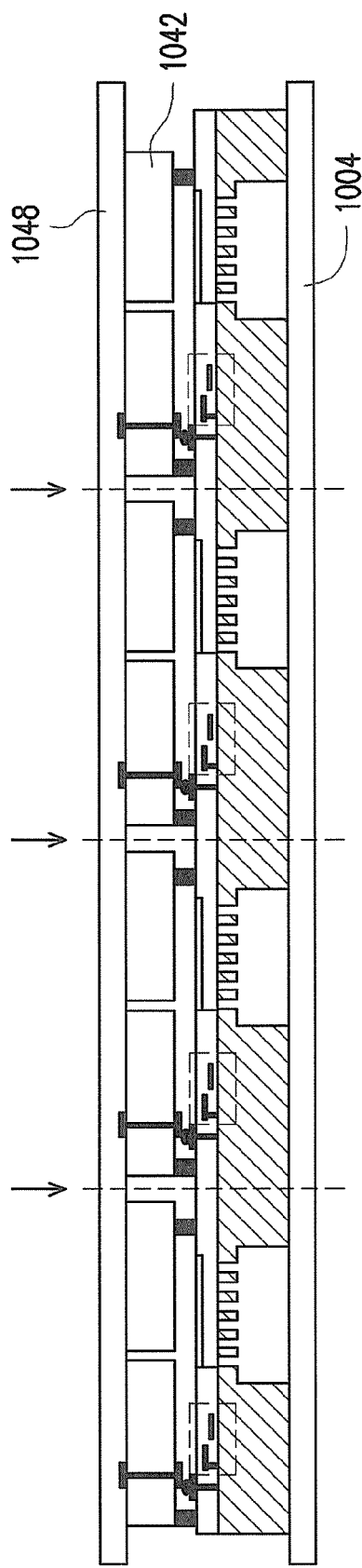
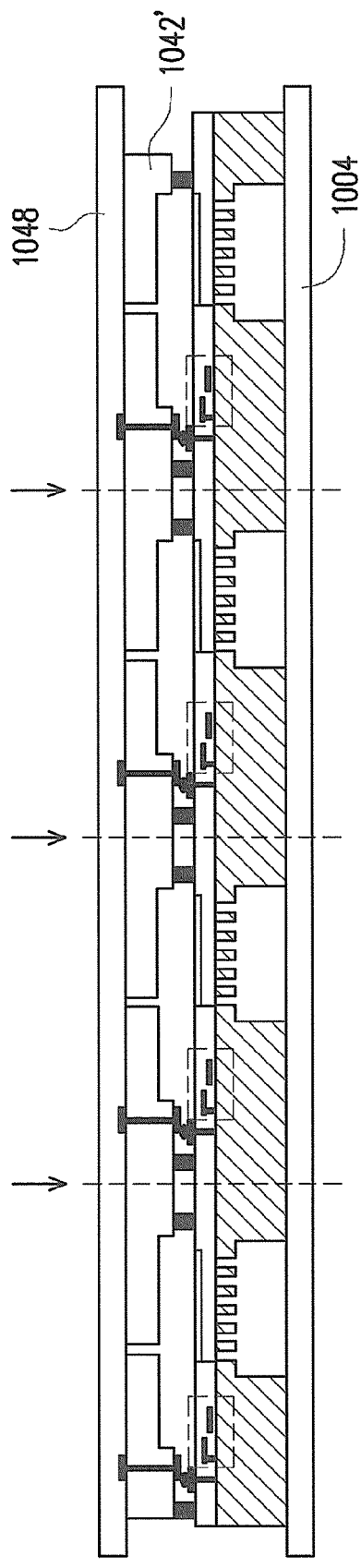
FIG. 31A
FIG. 31B

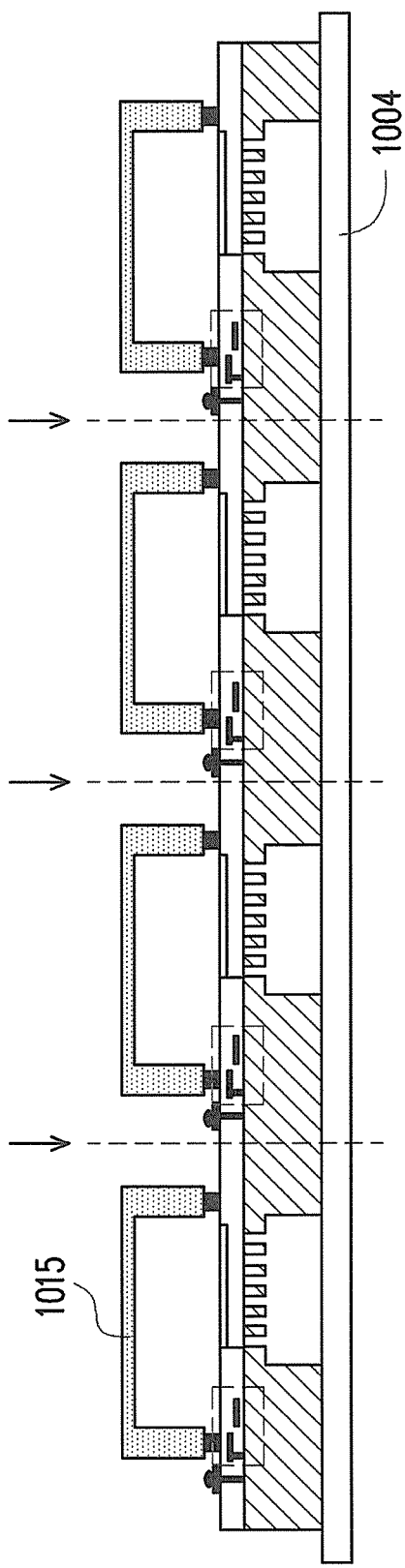
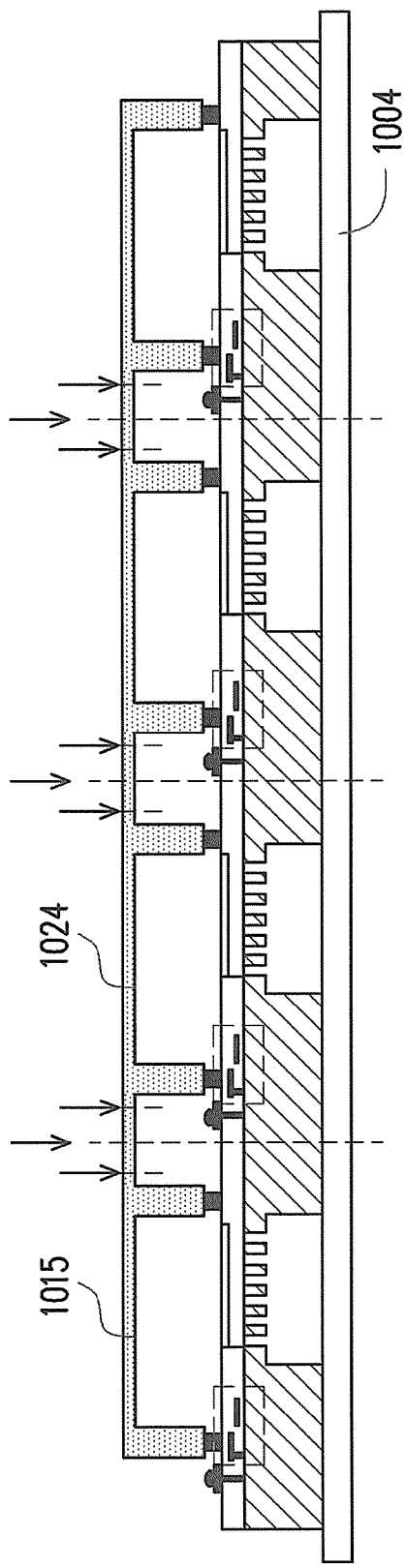
FIG. 32A
FIG. 32B

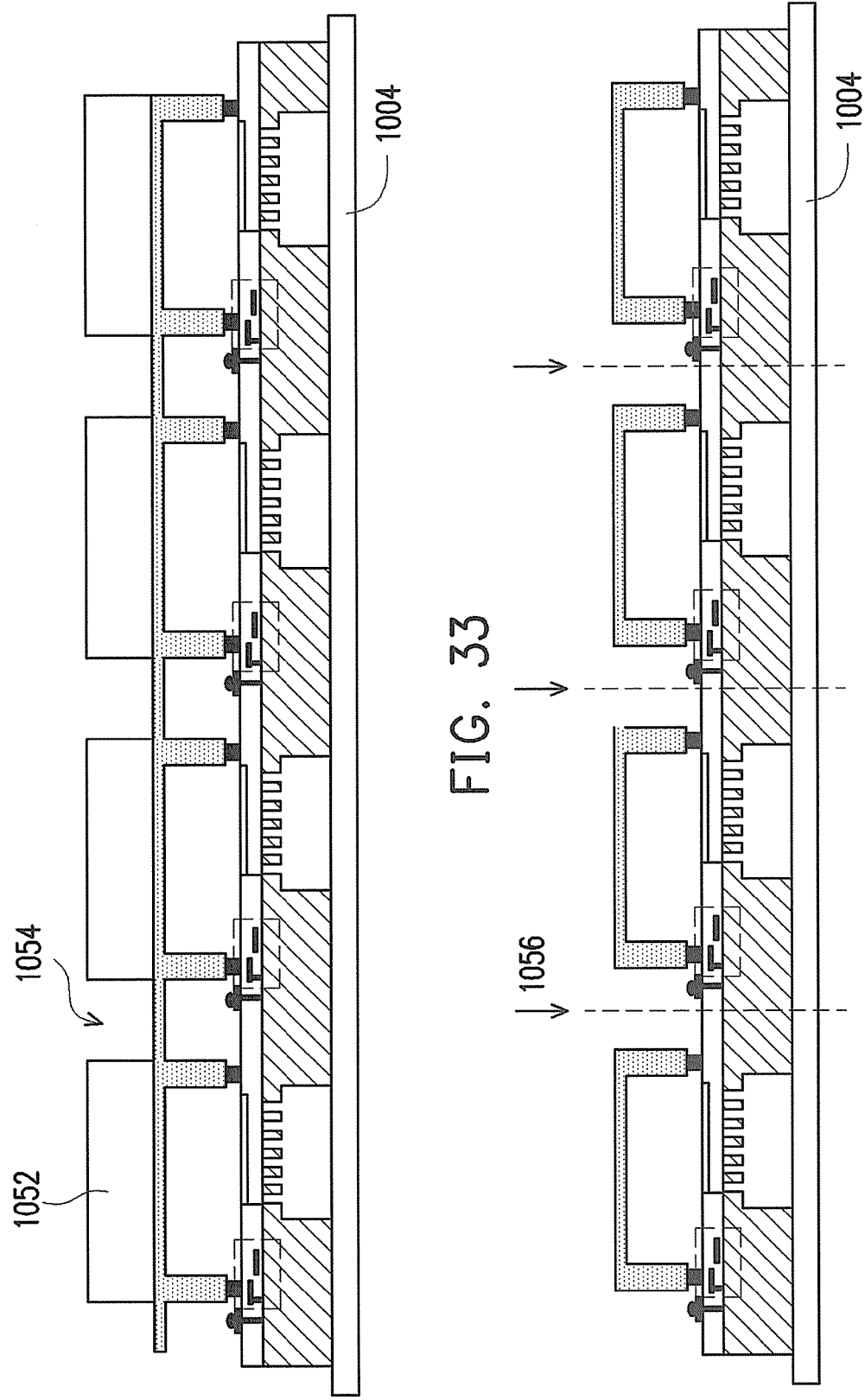

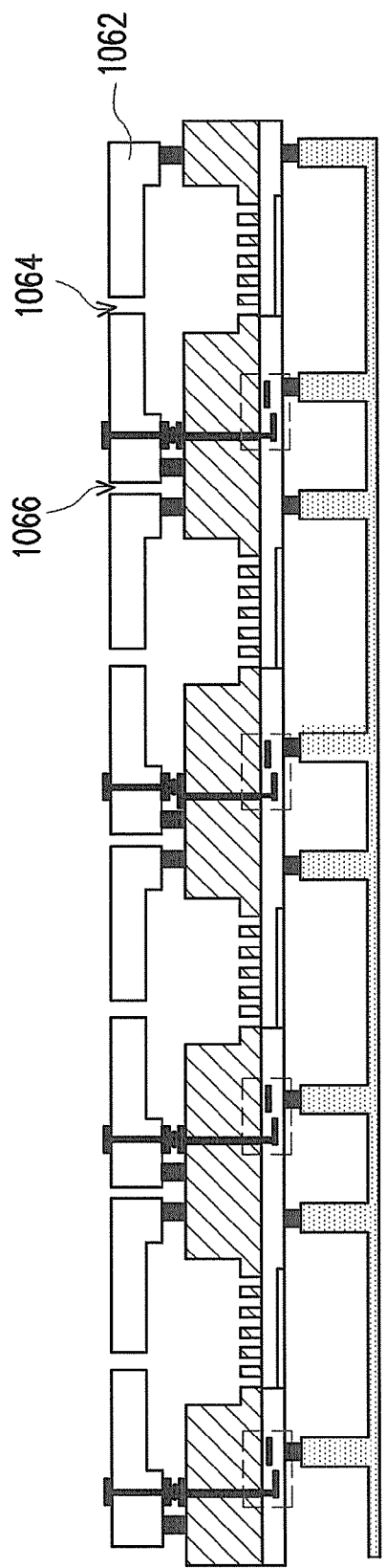
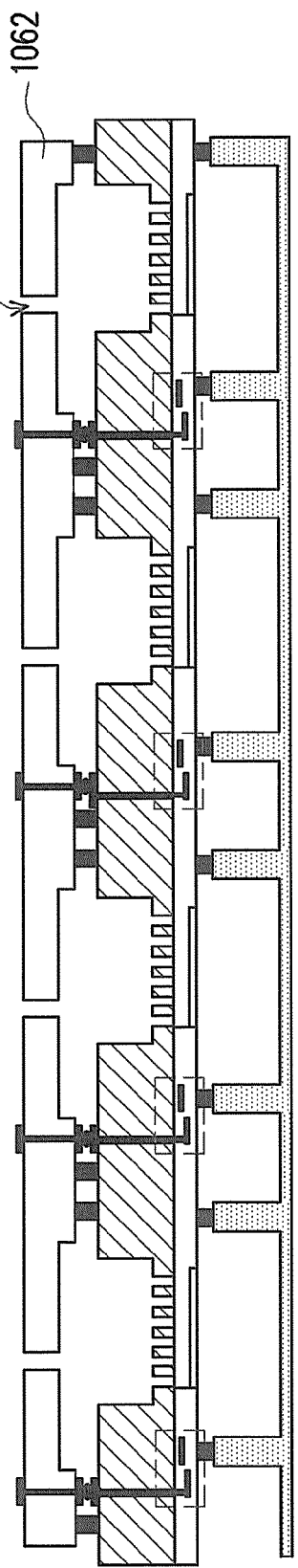
FIG. 36A
FIG. 36B

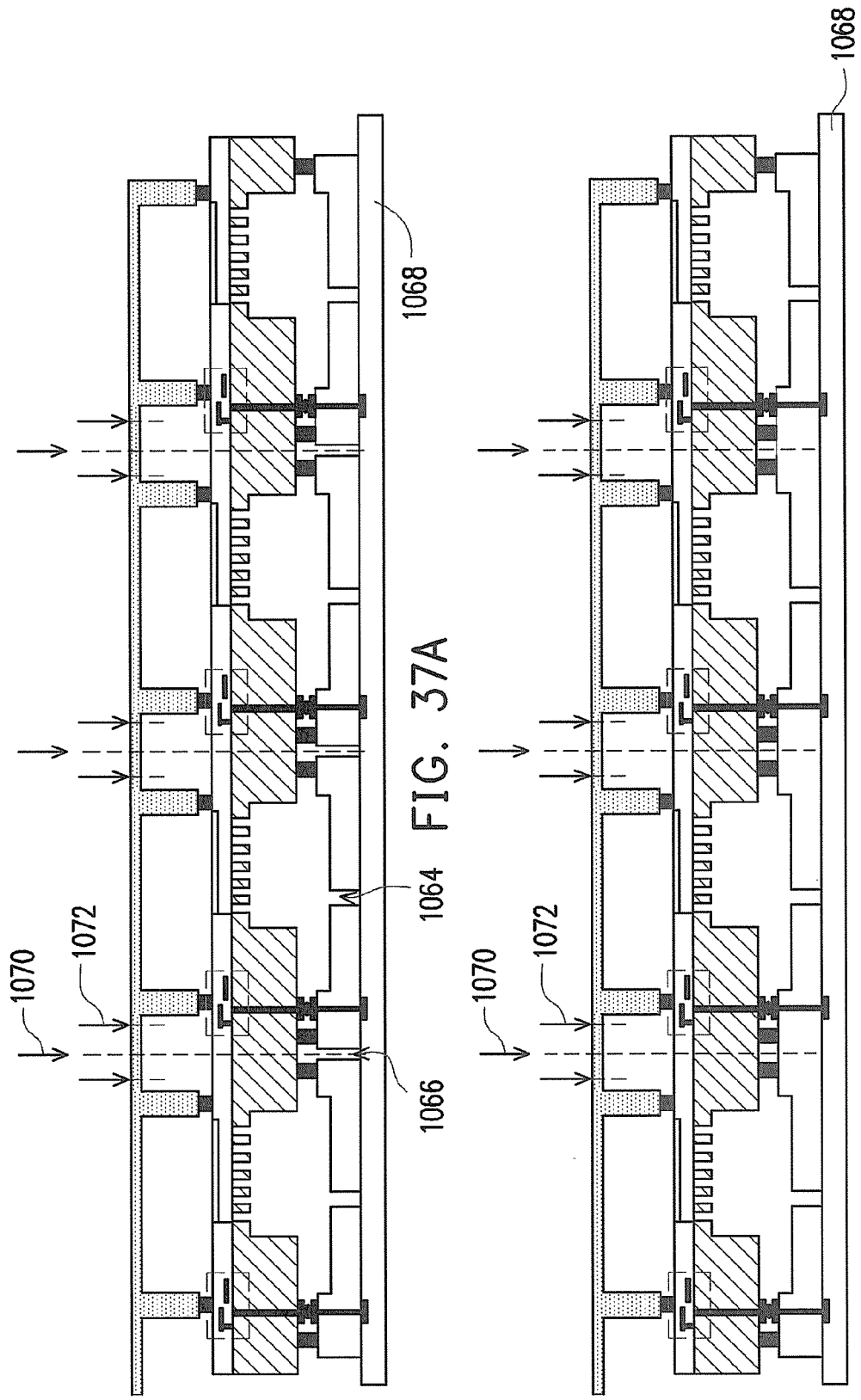

METHOD FOR FORMING MICRO-ELECTRO-MECHANICAL SYSTEM (MEMS) PACKAGE

CROSS-REFERENCE TO RELATED APPLICATION

This application is a divisional application of and claims the priority benefit of an U.S. application Ser. No. 12/203,151, filed on Sep. 3, 2008, now pending. The entirety of the above-mentioned patent application is hereby incorporated by reference herein and made a part of this specification.

BACKGROUND OF THE INVENTION

1. Field of Invention

The invention relates to a micro-electro-mechanical system (MEMS) package technology. More particularly, the invention relates to a MEMS package, such as the MEMS microphone capable of being chip-size scale.

2. Description of Related Art

MEMS microphone has been popular gradually due to the excellent features comparing to the conventional ECM microphone. The features of MEMS microphone includes: 1. thin and small size. 2. SMD (surface mountable device) indicating easy assembly with sold flow. 3. high stability and environmental resistance. However, in comparison with the IC package, the requirements of microphone package include receiving the sound pressure from acoustic signal, inducing mechanical motion and transferring to electrical signal. Therefore it needs an acoustic path to receive the sound pressure, a transducer to response the sound pressure, a sufficient back volume for transducer to reduce the damping coefficient and a good shielding to protect it from EMI. Currently, the most popular package is that the transducer is mounted on PCB and electrically couple to such PCB, and the conductive housing with an aperture is attached to the PCB enclosing the transducer. (FIG. 1) However, in such a way, the back volume of a transducer is only decided by the volume of the cavity of a transducer, indicating a small back volume and high damping coefficient to degrade the microphone performance.

Currently, most transducers have two chips in the package. One is the pure MEMS devices; the other is sensing IC. The drawbacks are: 1. large package size, 2. parasitic effect for the electrical connection between IC and MEMS devices. 3. high cost for extra sensing IC. It is inevitably intended for the miniature package size and low cost. Moreover, CSP (chip scale package) and wafer level package becomes more popular due to high electrical performance, small package size (as small as the chip size) and low cost. Such two chips in one package is not suitable to such CSP or WLP process. By the way, the size of a package mentioned above is also always larger than that of the transducer because the transducer has to be enclosed in the package.

FIG. 1 is a cross-sectional view, schematically illustrating a structure of conventional MEMS microphone. In FIG. 1, the conventional MEMS microphone includes a substrate 100. A MEMS microphone device 104, serving as a transducer, is formed on the substrate 100. MEMS microphone device 104 has a cavity 102 and a diaphragm over the cavity, allowing the diaphragm to vibrate with the acoustic sound. An integrate circuit (IC) 106 is also formed on the substrate 100. The bonding wire is used for the electric connection, so that the MEMS microphone device 104 is connected with the IC 106 for operation. Usually, the MEMS microphone package also needs a cover 108 to protect the MEMS microphone device 104 and the IC 106. In order to sense the acoustic sound from the environment, an aperture 110 is made to receive the acoustic sound. However, since the volume of the cavity 102 of the MEMS microphone device 104 is small. The sensitivity is insufficient.

How to design a MEMS microphone with more sensitivity or even in chip-size scale is still under development.

SUMMARY OF THE INVENTION

The invention provides a method for forming a plurality of MEMS units on a substrate, wherein each of the MEMS units comprises at least one MEMS sensing element and a first chamber over a sensing element, wherein the MEMS units include electric connection pads; forming a plurality of covering units correspondingly over the MEMS devices, wherein each of covering units provides a second chamber over the sensing element opposite to the first chamber; adhering the covering units to the MEMS units via the adhesive material; and dicing the MEMS units into singulated units.

In an embodiment of the method for fabricating the MEMS package, for example, the covering units include an adhesive material on the surface of covering units facing the MEMS devices.

In an embodiment of the method for fabricating the MEMS package, for example, each covering unit includes an interconnection structure, wherein the interconnection structure includes a conductive paste.

In an embodiment of the method for fabricating the MEMS package, for example, wherein the MEMS units include a metal bump on the connection pad.

In an embodiment of the method for fabricating the MEMS package, for example, the adhesive layer forms a ring to surround the sensing element and the bonding structure is outside the ring.

In an embodiment of the method for fabricating the MEMS package, for example, the adhesive layer forms a ring to surround the sensing element and the bonding structure is included in the ring.

In an embodiment of the method for fabricating the MEMS package, for example, the adhesive layer and conductive paste form a ring to surround the sensing element.

In an embodiment of the method for fabricating the MEMS package, for example, the supporting layer is attached under the substrate of MEMS units for dicing.

In an embodiment of the method for fabricating the MEMS package, for example, the step of dicing the MEMS microphone units is directly dicing a base substrate of the MEMS microphone units.

In an embodiment of the method for fabricating the MEMS package, for example, before dicing the MEMS units, further comprising forming a supporting layer under the substrate of MEMS units covering the first chamber to protect sensing element from water jet during dicing.

In an embodiment of the method for fabricating the MEMS package, for example, the covering units are formed on a substrate in joining together by a substrate portion.

In an embodiment of the method for fabricating the MEMS package, for example, the covering units are formed on a continuous substrate with a joining portion, and the step of dicing the MEMS units comprising: removing the joining portion by etching; and dicing the continuous substrate of the MEMS units.

In an embodiment of the method for fabricating the MEMS package, for example, before dicing the MEMS units, further comprising forming a protection layer over the covering units at opposite side to the supporting layer to protect sensing element from water jet during dicing.

In an embodiment of the method for fabricating the MEMS package, for example, the covering units are formed on a continuous substrate with a joining portion, and the step of dicing the MEMS units comprising: performing a first dicing to remove the joining portion; and dicing the continuous substrate of the MEMS units.

In an embodiment of the method for fabricating the MEMS package, for example, the supporting layer protects the MEMS units from water jet during dicing.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 20-37 are cross-sectional views, schematically illustrating various fabrication processes for the MEMS device, according to embodiments of the invention.

DESCRIPTION OF THE EMBODIMENTS

In the invention, the MEMS microphone is provided. The MEMS microphone has an additional room, connected to the sensing element of the MEMS microphone device. As a result, the sensitivity can be improved. Several embodiments are provided for descriptions of the invention. However, the invention is not just limited to the embodiments. Further, the embodiments can be properly combined to each other without limited to an individual embodiment.

To solve conventional issue, the invention proposes a novel method to form MEMS microphone package. For example, the MEMS transducer and sensing IC are integrated into a single chip. A cover made of for example, silicon substrate, PCB, or ceramics is mounted on the surface of a single chip enclosing the MEMS area. The size of such package is as small as the microphone chip size. Moreover, the vent holes in the back plate of the transducer on the backside of the microphone chip can be acted as a sensing port to allow the acoustical signal to input.

The invention uses, for example, the stud bumping technology, B-stage conductive Epoxy or solder paste to replace the electrical connection of conventional solder bumping. For the technology of solder bumping, it is necessary to grow the UBM (under bump metallurgy) before implanting solder bump. However, the MEMS structure is usually formed before the formation of UBM layer. The formation of UBM layer will damage the MEMS structure if the solder bump is formed on the surface of MEMS chip. However, the stud bumping does not need UBM layer. The metal bump can be formed directly on conductive PAD using such a technology. Therefore, the MEMS area is not damaged. The bump can be used to electrical connection efficiently. For another technology of B-stage conductive Epoxy, it is also not necessary to use UBM layer. It can be formed directly on the substrate of silicon wafer or PCB for MEMS covering units with stencil printing indicating easy and productive process. The electrical connection is finished by anticipating the attachment of two substrates with curing. The technology is suitable not only to microphone but various MEMS packages.

Figure 1:
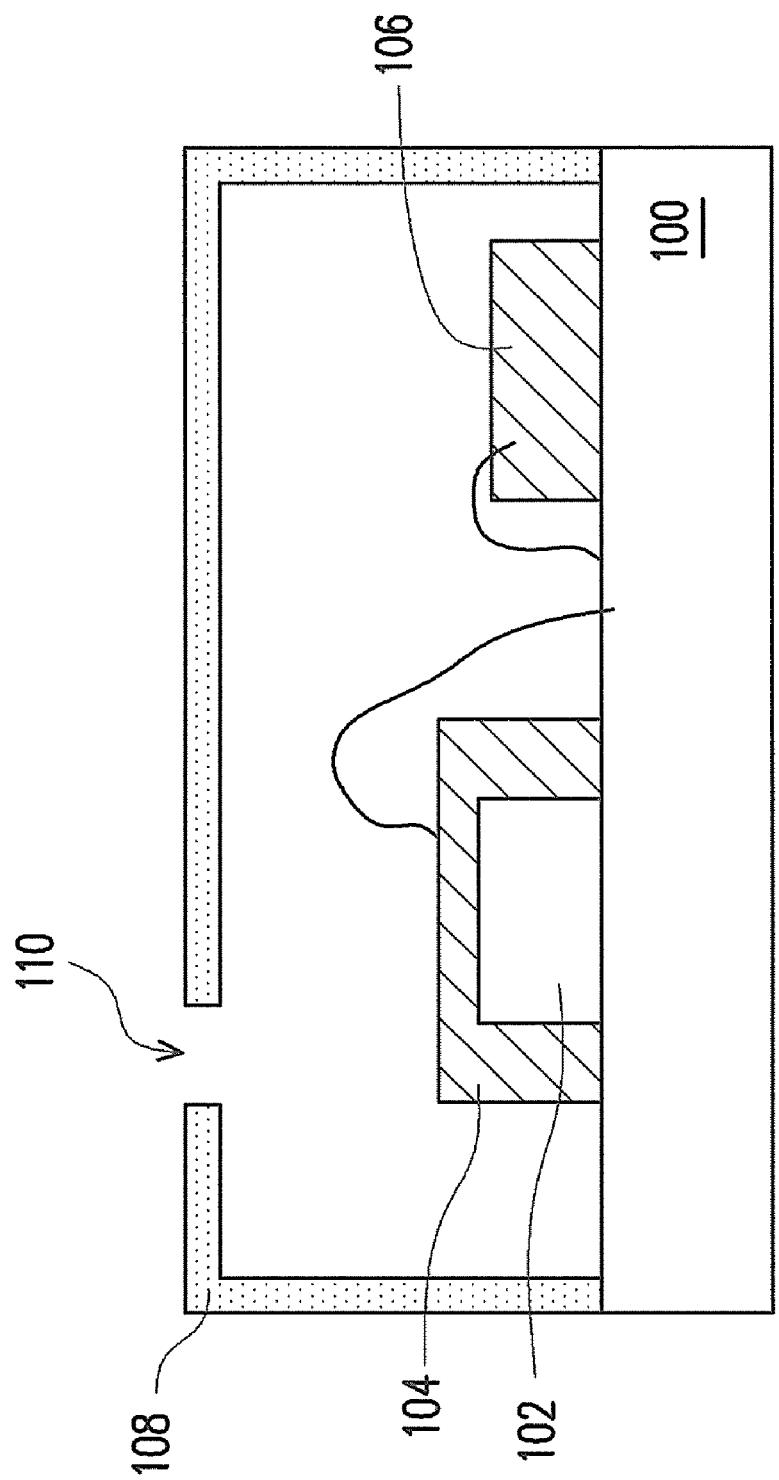
FIG. 1 is a cross-sectional view, schematically illustrating a structure of conventional MEMS microphone.
Figure 2:
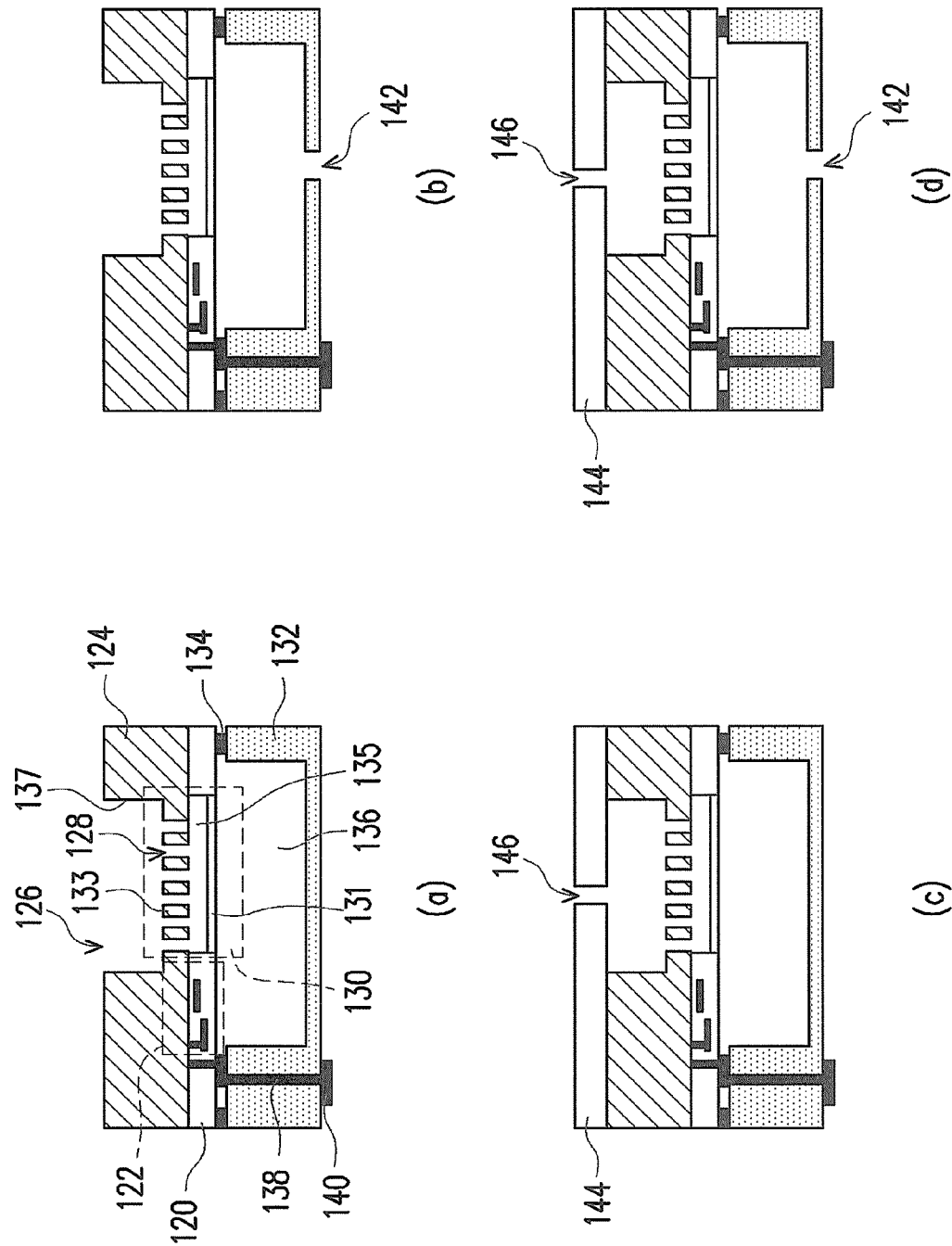
FIGS. 2-19 are drawings in cross-sectional view and/or top view, schematically illustrating structures of MEMS devices, according to various embodiments of the invention.

FIGS. 2-19 are drawings in cross-sectional views and/or top view, schematically illustrating structures of MEMS packages, according to various embodiments of the invention. In FIG. 2, an embodiment is shown in FIG. 2(a), the MEMS packages in a basic structure includes a MEMS microphone device. The MEMS microphone device has a first substrate 124 and both a structural dielectric layer 120 and sensing element 130 on the first substrate 124. Such an acoustic sensing element includes a moveable sensing diaphragm 131, a rigid perforated back plate 133 and a gap 135 between the diaphragm and back plate. An integrated circuit 122 is also formed in the first substrate 124 and the structural dielectric layer 120 for driving the MEMS microphone device. A first chamber 126 in the MEMS microphone device is connected to the sensing element 130 through the holes 128 in back plate. The first chamber has an opening 137 opposite to the sensing element. A second substrate 132 is disposed on the structural dielectric layer 120 of the MEMS microphone device to provide a second chamber 136 in the second substrate 132 over the sensing element 130 opposite to the first chamber 126.

The second substrate 132 can be, for example, about the same size as the MEMS microphone device as a chip. The second substrate 132 can be adhered to the structural dielectric layer 120 by adhesive material 134. As can be understood, the second substrate 132 has an interconnection structure including, for example, connection via 138 and the pad 140. The connection via 138 can connected to the I/O terminal of the integrated circuit 120, so that the I/O terminals are redistributed to the pad 140 for connection out. The structural dielectric layer 120 also includes the interconnection structure for connection to the integrated circuit 122 and coupling between sensing element 130 and integrated circuit 122. In other words, the integrated circuit 122 can be connected out. The interconnection can be understood by one with the ordinary skill in the art.

In this structure of MEMS package, the chamber 136 can provide a larger space for the acoustic sensing element 130 in sensing. The larger space shows higher mechanical compliance for acoustical sensing diaphragm indicating higher acoustic sensitivity.

Based on the structure in FIG. 2(a), several other structure options can be made, for example. In FIG. 2(b), the second substrate 132 may have an aperture 142 for connecting the second chamber 136 to an environment. This aperture 142 can adjust the sensitivity in option or can be the $2^{nd}$ aperture for the application of directional microphone. In FIG. 2(c), a covering layer 144 may be formed over the substrate 124 to cover the first chamber 126 to protect the sensing element from particles or EMI. However, in this situation, an aperture 146 is in the covering layer 144 for coupling the first chamber 126 to the environment while the second chamber 136 is not coupled to the environment. In FIG. 2(d) for alternative option, both the apertures 146 and 142 can be formed for the application of directional microphone. In one of applications as a microphone, for example, the aperture can receive the acoustic signal, and the diaphragm can sense the flow pressure. The two chambers 126, 136 locate at both sides of the sensing element 130.

Figure 4:
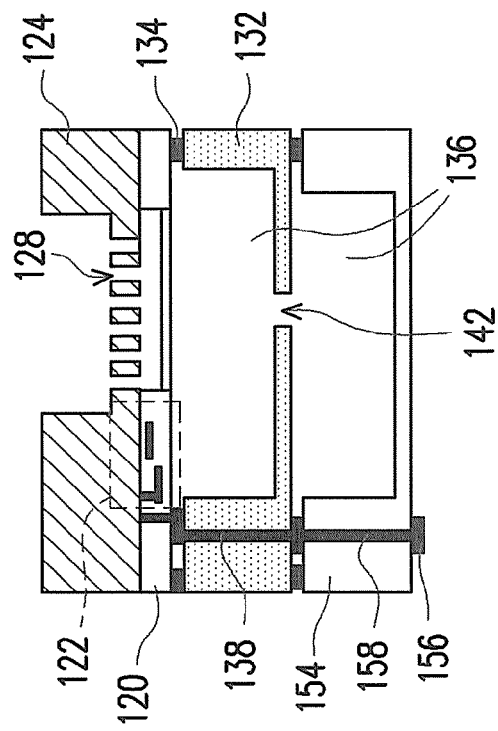
Figure 3:
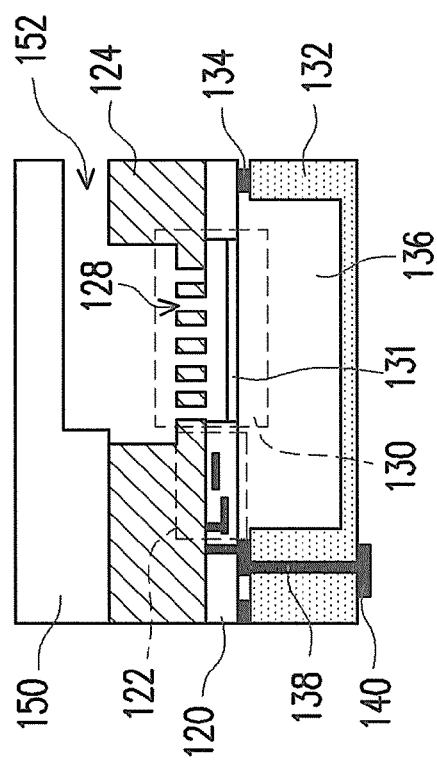

Based on the same design principle from FIG. 2, in FIG. 3, another substrate 150, serving as a covering layer 150, can be formed on the first substrate 124. As a result, the first chamber 126 can be covered by the covering layer 150. However, the covered by the covering layer 150 can have an indent region and a side aperture 152 can be formed. The side aperture can connect the first chamber 126 to an environment. The aperture located on the side of microphone device can increase the feasibility for user application. In FIG. 4, alternatively, another substrate 154, serving as cap function, can also be added. The substrate 154, as the third substrate 154, is disposed over the second substrate 132 with similar structure at the chip-size scale, for example. The third substrate 154 also has the interconnection structure, including a connection via 158 and a conductive pad 156 for electric connection out. However, the aperture 142 allows the two chambers 136 to be coupled together. In this situation, the volume of the back chamber can be expanded.

Figure 6:
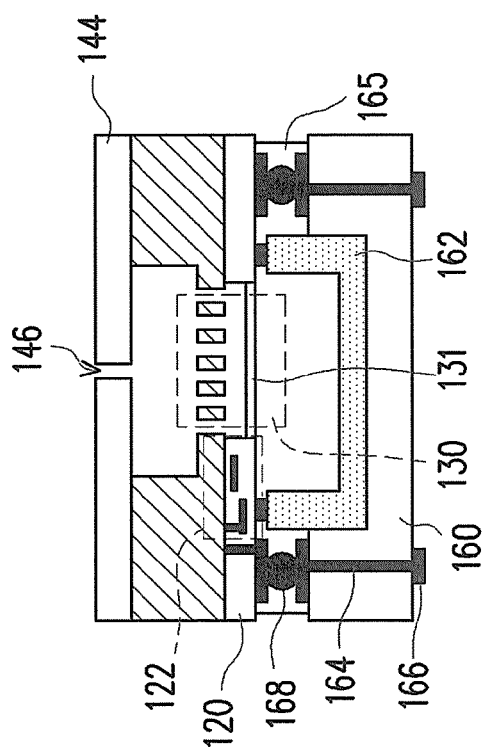
Figure 5:
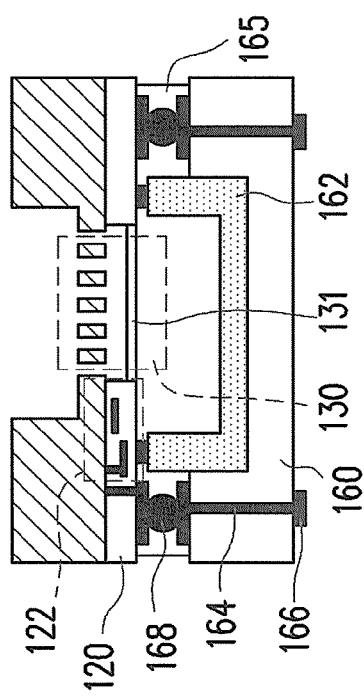

In FIG. 5, alternatively, the second substrate 162 can be formed over the MEMS microphone device from the other structural dielectric layer 120. In this embodiment, the second substrate 162, serving as a cover 162 over the sensing element 130 and protecting the sensing element from damage during packaging, is not necessary to have the interconnection structure. However, the third substrate 160 can have the interconnection structure having the via 164 and conductive pad 166, which can be coupled to the integrated circuit 122 electrically, such as the metal bump 168 like stud bump or conductive paste 168 like B-stage epoxy or solder paste. However, in order not to add thickness, the substrate 160 can have an indent region to adapt the second substrate 162. The filling material 165 is filled in the gap between the structural dielectric layer 120 and the substrate 160 and seals the metal bump to provide the reliable package quality. In other words, the cover 162 is just used as the cover without interconnection structure. In FIG. 6, based on the structure in FIG. 5, the covering layer 144 can be further formed over the MEMS microphone device above the first chamber. The covering layer 144 has an aperture 146 for coupling the first chamber to the environment to protect the sensing element from particles.

Figure 7:
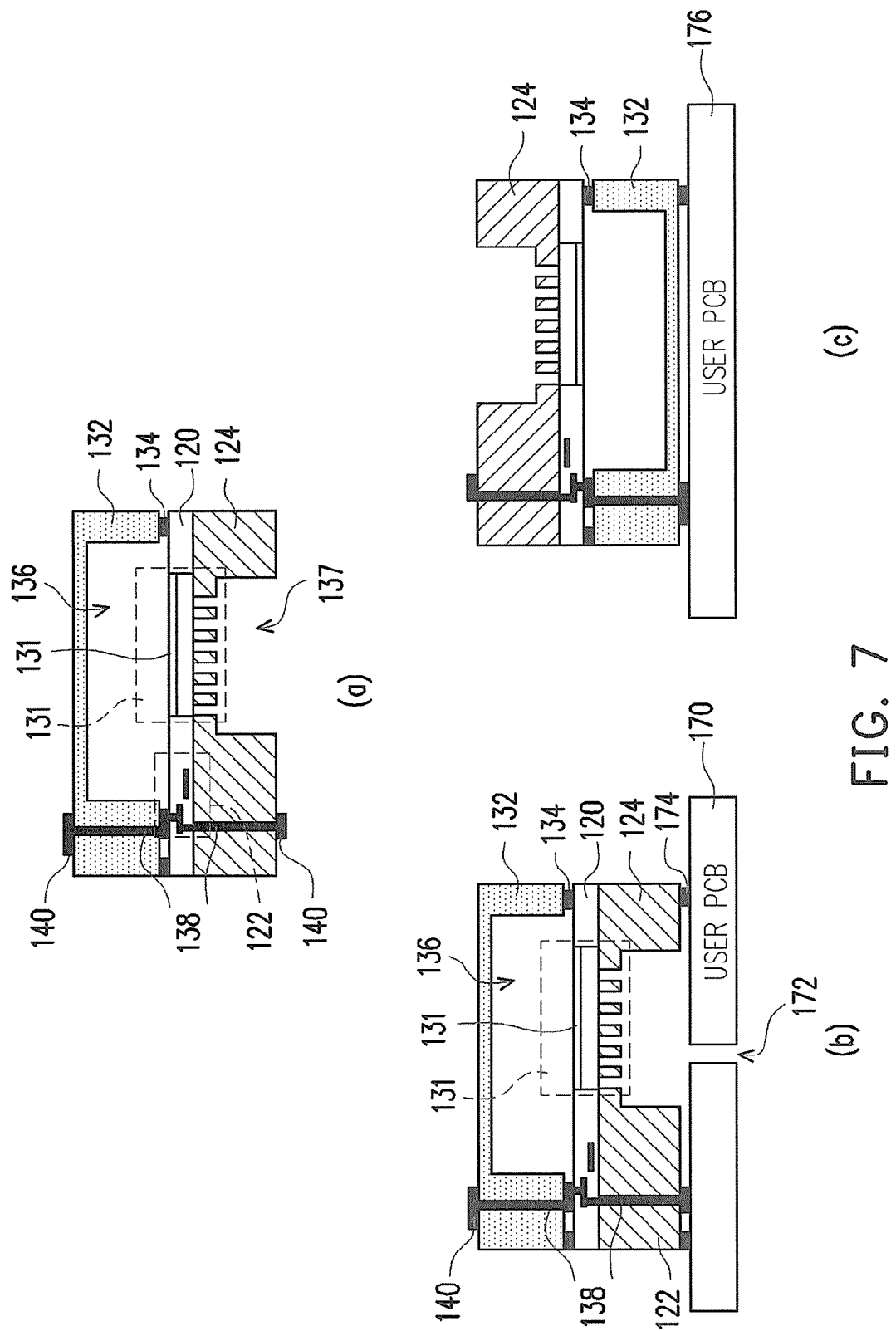

In FIG. 7(*a*), the first substrate 124 of the MEMS microphone device has the opened chamber 137 downward and has the interconnection structure of via 138 and conductive pad 140. In this situation, the MEMS package can be externally connected out from both sides to provide a feasible application to user. In FIG. 7(*b*), further for example, in the application of MEMS device on user's PCB, the MEMS package can be coupled to the user's printed circuit board (PCB) 170 by the adhesive material 174. The PCB 170 can have an aperture 172 as a sensing aperture, coupled to the first chamber 137. In FIG. 7(*c*), since the MEMS package allows the connection from both sides, the second substrate 132 of the MEMS package can be coupled to the PCB 176 while the chamber 137 remains opened.

Figure 8:
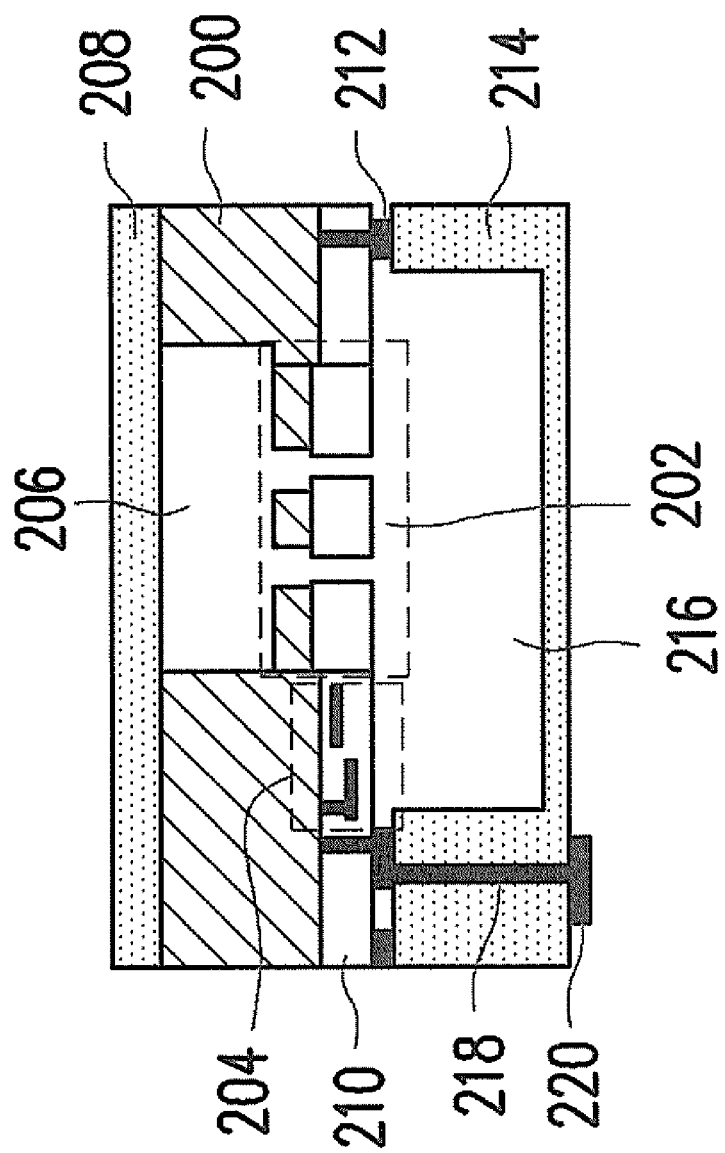

In FIG. 8, the MEMS package can be used in other applications, such as the apparatus for inertial sensor, e.g. acceleration. In this situation, the MEMS package has the first substrate 200 with the sensing element 202, e.g. moveable proof mass, which is a mass-source for sensing the acceleration, for example. This application does not need to receive the acoustic signal and therefore the cover 208 seals the chamber 206 and the substrate 214 is adhered to the MEMS device by the adhesive 212, which may also be usual paste or conductive paste. The chamber 216 at the other side of the sensing element 202 can be formed. Similarly, the integrated circuit 204 in the structural dielectric layer 210 can be interconnected out by the via 218 and the conductive pad 220. Both chambers 206, 216 are hermetic to isolate from the outside environment and allows the proof mass to move freely. The hermetic package in FIG. 8 can be used in other MEMS package in which the hermetic package is needed, e.g. RF, actuator and etc.

Figure 9:
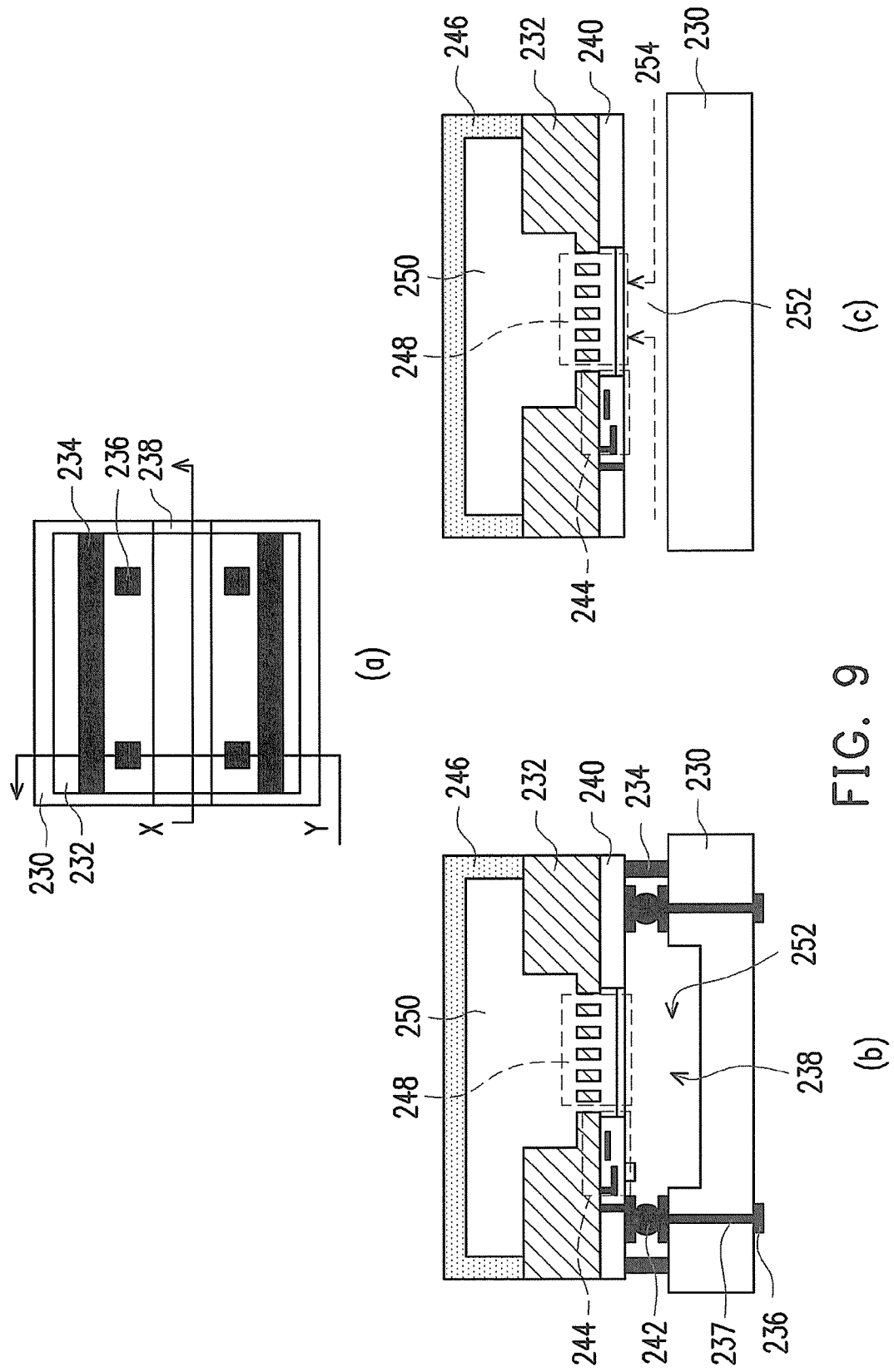

Further embodiment in FIG. 9(*a*), it is a top view. FIG. 9(*b*) and FIG. 9(*c*) are the cross-sectional views at the Y cutting line and X cutting line in FIG. 9(*a*). In structure of FIG. 9, the MEMS microphone device includes a first substrate 232 and a structural dielectric layer 240, in which an integrated circuit 244 is formed inside. The acoustic sensing element 248 is coupled to the first chamber 250. In this embodiment, the second substrate 230 is formed over the structural dielectric layer 240 to form a second chamber 252 at one side of the sensing element 248. Likewise, the interconnection structure with the via 237 and conductive pad 236 in the second substrate 230 is used to connect I/O terminals of the integrated circuit 244 out with the bonding structure 242, such as the metal bump or conductive paste. The adhesive material 234 is used to adhere the MEMS microphone device with the second substrate 230. However, in order to allow the chamber 252 to receive the external acoustic signal, a ditch 238 is formed. In FIG. 9(*c*) at the X cross-sectional view, the ditch 238 indeed provides the path for receiving the acoustic signal from sides. The cover layer 246 can be just a cap to cover the chamber 250 with expanded volume. As a result, the MEMS package can be formed.

Figure 10:
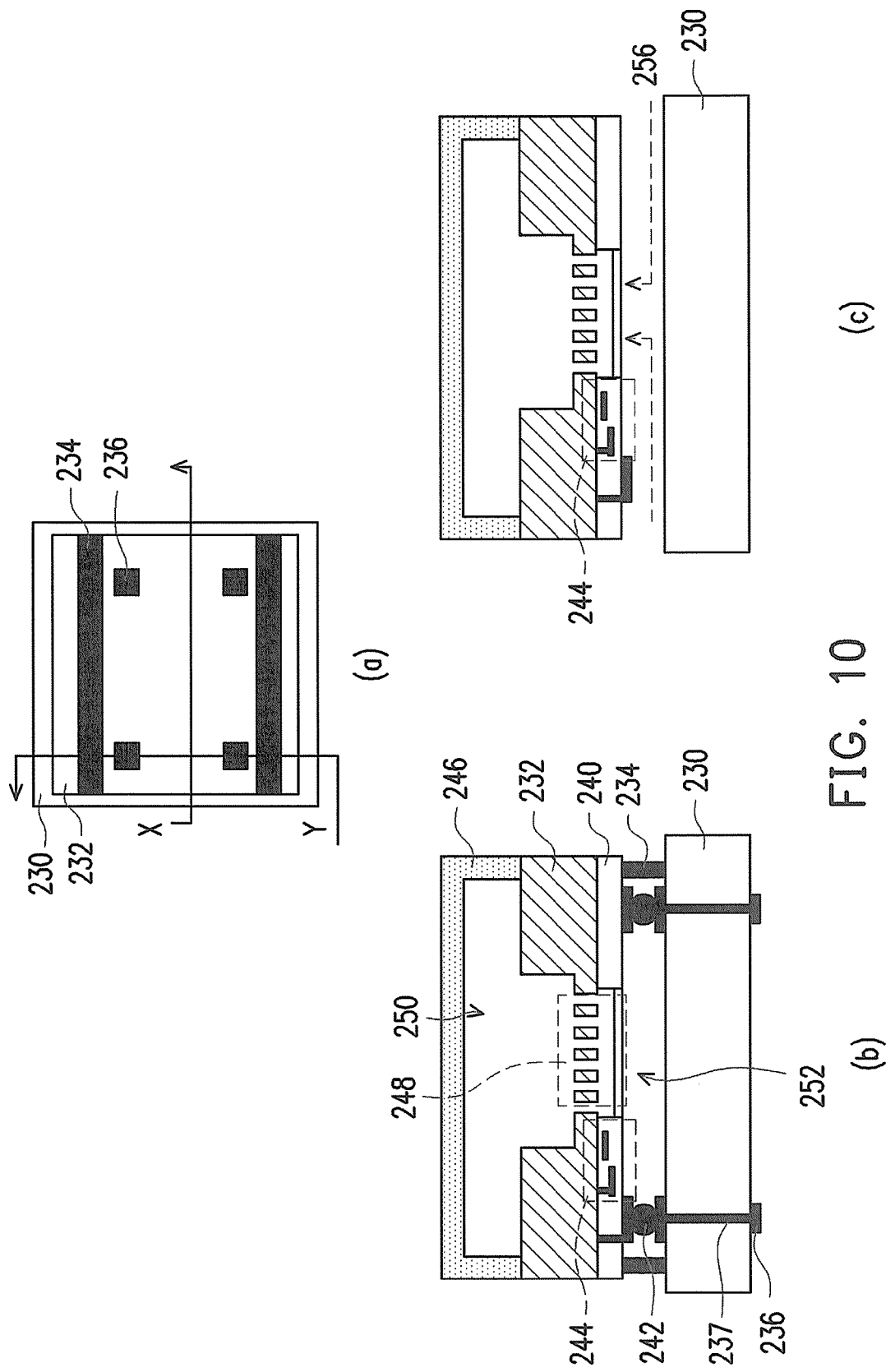

Similarly to FIG. 9, in FIG. 10, FIG. 10(*a*) is a top view. FIG. 10(*b*) and FIG. 10(*c*) are cross-section views in FIG. 10(*a*) at the cutting line Y and cutting line X. In this embodiment, the ditch 238 in FIG. 9 is not formed. In other words, the gap between the structural dielectric layer 240 and the substrate 230 is serving as the second chamber while all of the side aperture can receive the acoustic signal.

Figure 11:
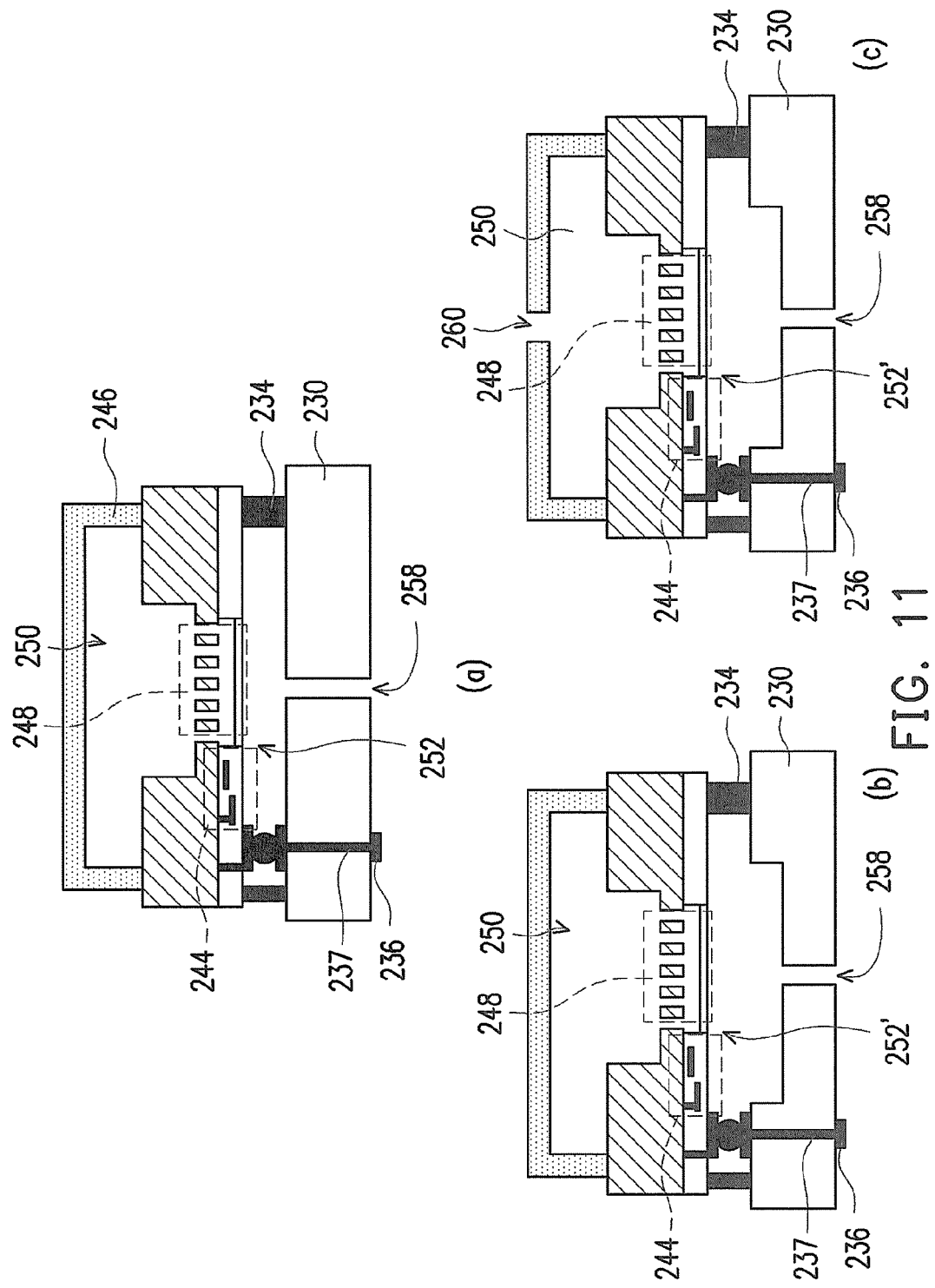

In FIG. 11, other embodiments are further shown. In FIG. 11(*a*), the MEMS package is similar to the structure in FIG. 10. However, the substrate 230 can be fully adhered to the MEMS microphone device without side aperture. The chamber 252 is coupled to the environment by the aperture 258 in the substrate 230. In FIG. 11(*b*), further, the substrate 230 can have the indent region to expand the chamber 252 into the chamber 252'. In FIG. 11(*c*), the cover layer 246 can also have the aperture 260 for coupling the first chamber 250 to the environment for the application of directional microphone.

Figure 12:
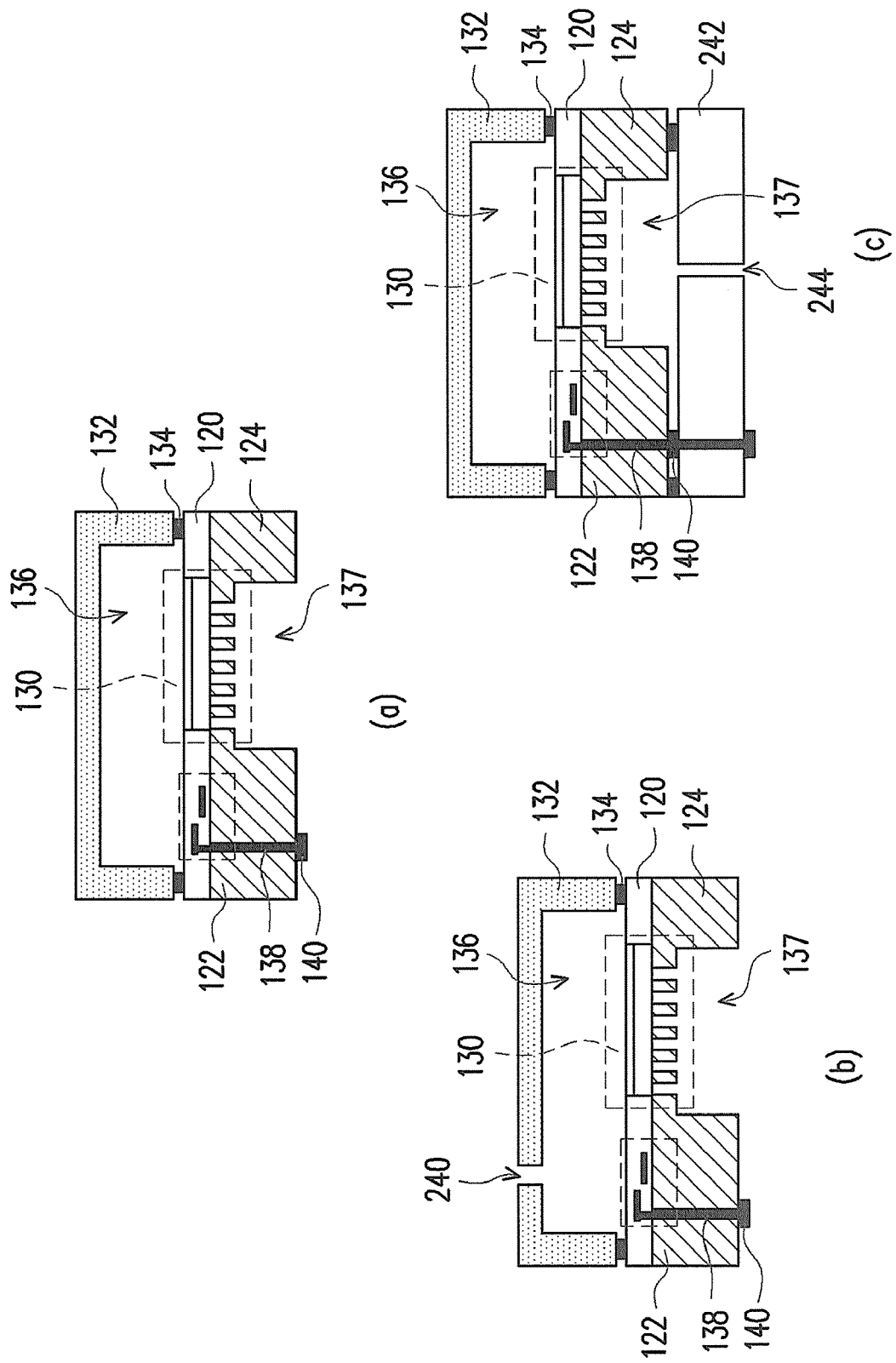

In FIG. 12, other embodiments are further shown. In FIG. 12(*a*), as previously described, the MEMS microphone device has the opened chamber 137 which the second substrate 132 can be just a cap 132 to seal a chamber 136 over the sensing element 130. The interconnection structure of via 138 and conductive pad 140 is formed in the substrate 124 for outer electric connection. In FIG. 12(*b*), the second substrate 132 has an aperture 240 for coupling the chamber 136 to the environment for the application of directional microphone. In FIG. 12(*c*), another substrate 242 can be further formed on the substrate 124. In this situation, the substrate 242 has an aperture 244 for coupling the chamber 137 to the environment which is the chamber 136 is sealed by the cap 132.

Figure 13:
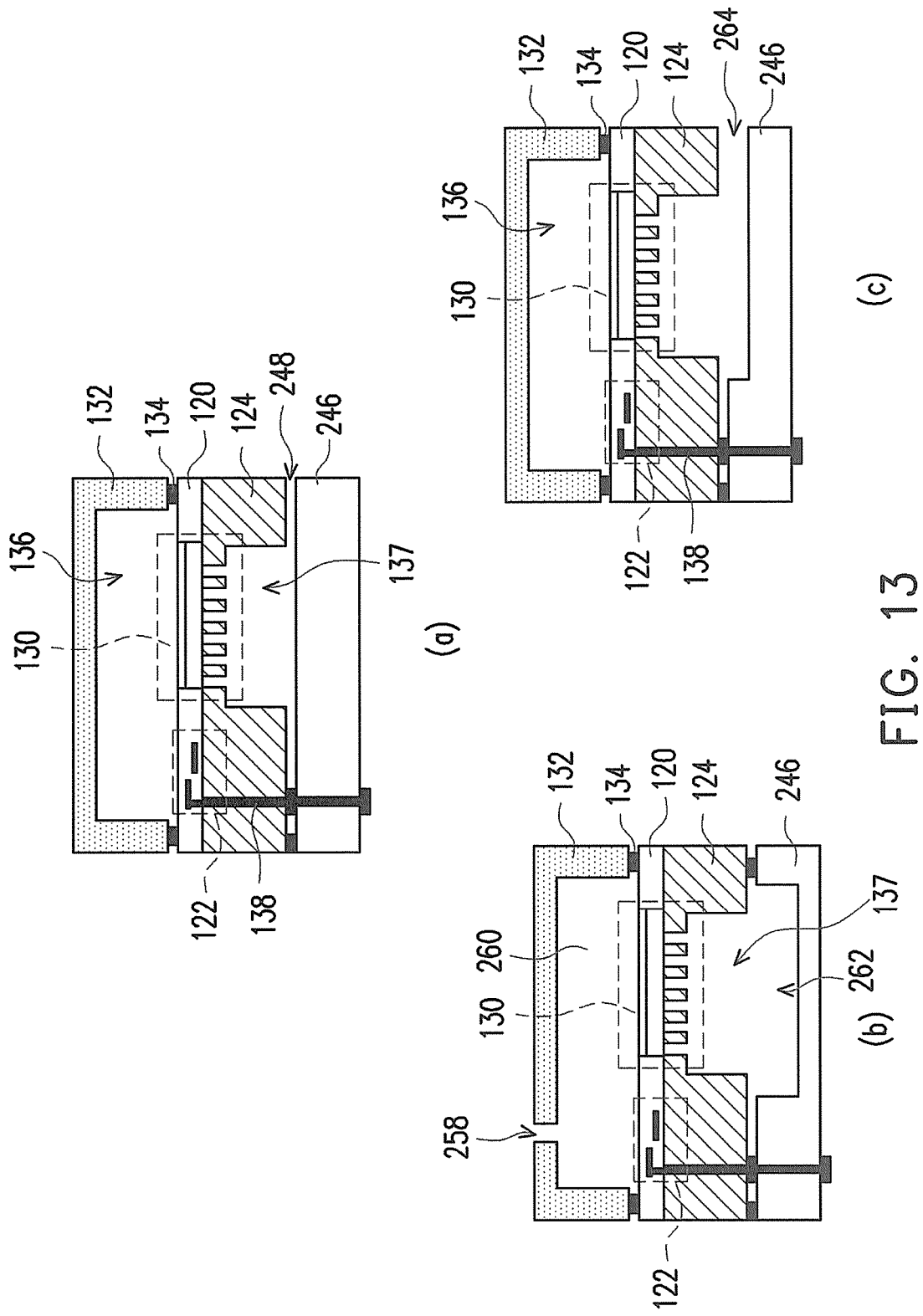

In FIG. 13, other embodiments are further shown. In FIG. 13(*a*), the substrate 246 is not fully cover the chamber 137 of the substrate 124. In this situation, a side gap 248 as an aperture is formed for receiving acoustic signal. In FIG. 13(*b*), alternatively, the substrate 246 fully seals the chamber 137 and has the indent region 262 to expand the volume of the chamber 137. In FIG. 13(*c*), the substrate 146 can also have the indent region and the side gap 264.

Figure 14:
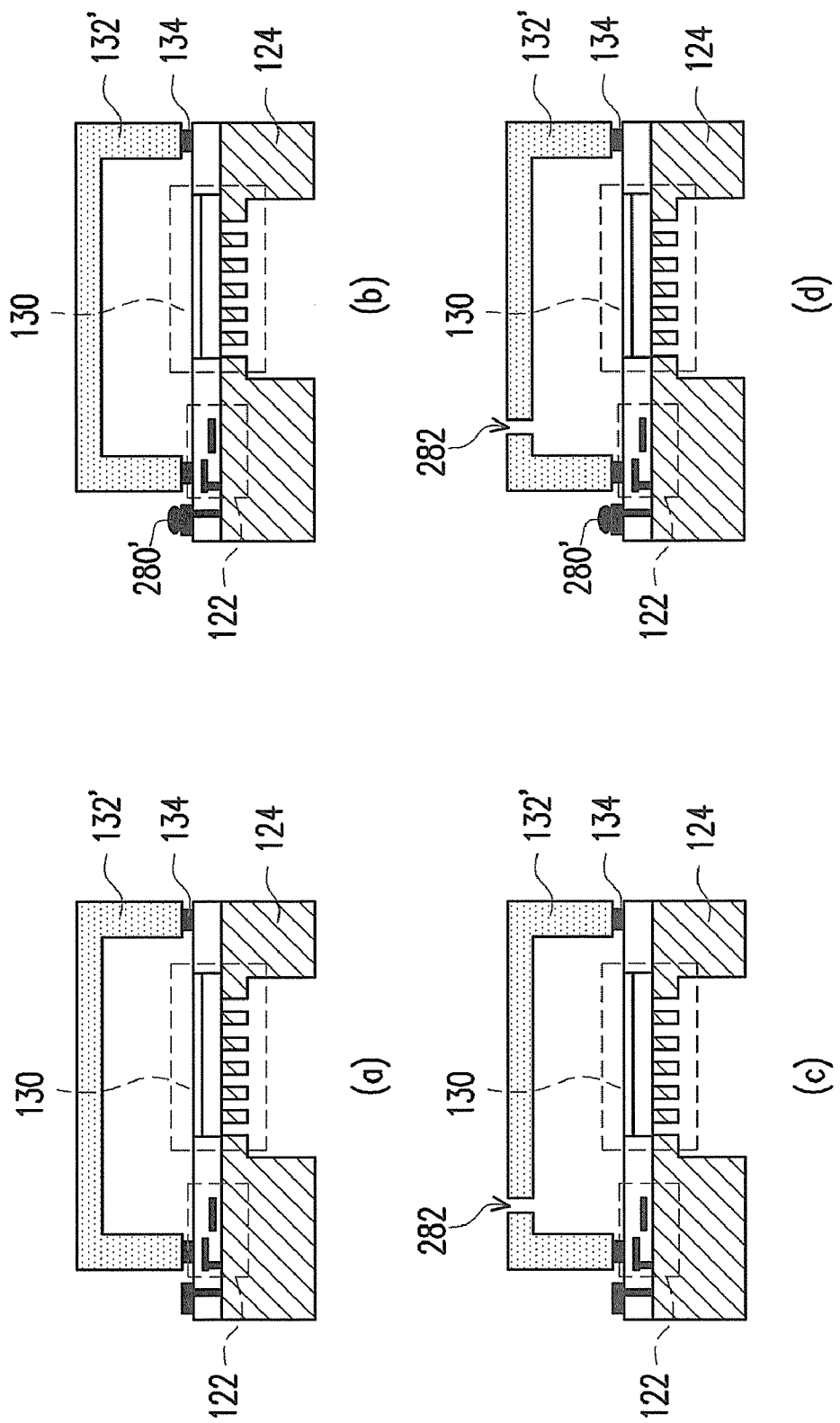

In FIG. 14, other embodiments are further shown. In FIG. 14(*a*), in this embodiment, the I/O terminal of the integrated circuit 122 can be exposed to the environment. The second substrate 132' can be just a cap and does not cover all portion of the I/O terminal. In this situation, the MEMS package allows several different packaging process later. In FIG. 14(*b*), in packaging process, for example, the metal bump 280' can be formed on the pad of the integrated circuit 122 by the technology of stud bumping or B-stage conductive epoxy. In FIG. 14(c), when the additional acoustic path is needed, the aperture 282 can be formed for the application of directional microphone. In FIG. 14(d), different from FIG. 14(c), the metal bump 280' can be formed on the pad of the integrated circuit 122 by the technology of stud bumping or B-stage conductive epoxy.

Figure 15:
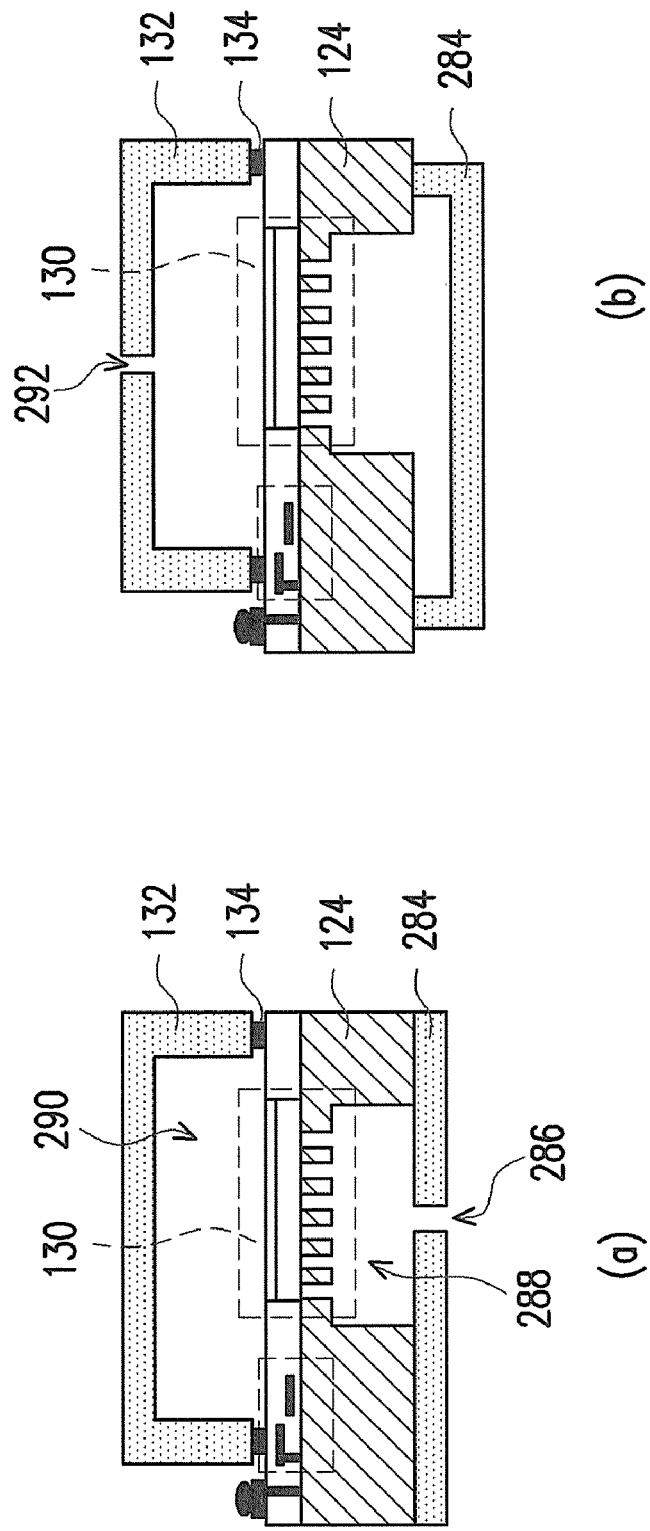

In FIG. 15, other embodiments are further shown. In FIG. 15(a), an additional covering layer 284 can be further formed over the substrate 124 and cover the chamber 288. The covering layer 284 has an aperture 286 for coupling the chamber 288 to the environment. The cap 132 also forms the chamber 290. In FIG. 15(b), the covering layer 284 does not have aperture. However, instead, the covering layer 132 has the aperture 292. These are the choices according to the actual need.

Figure 16:
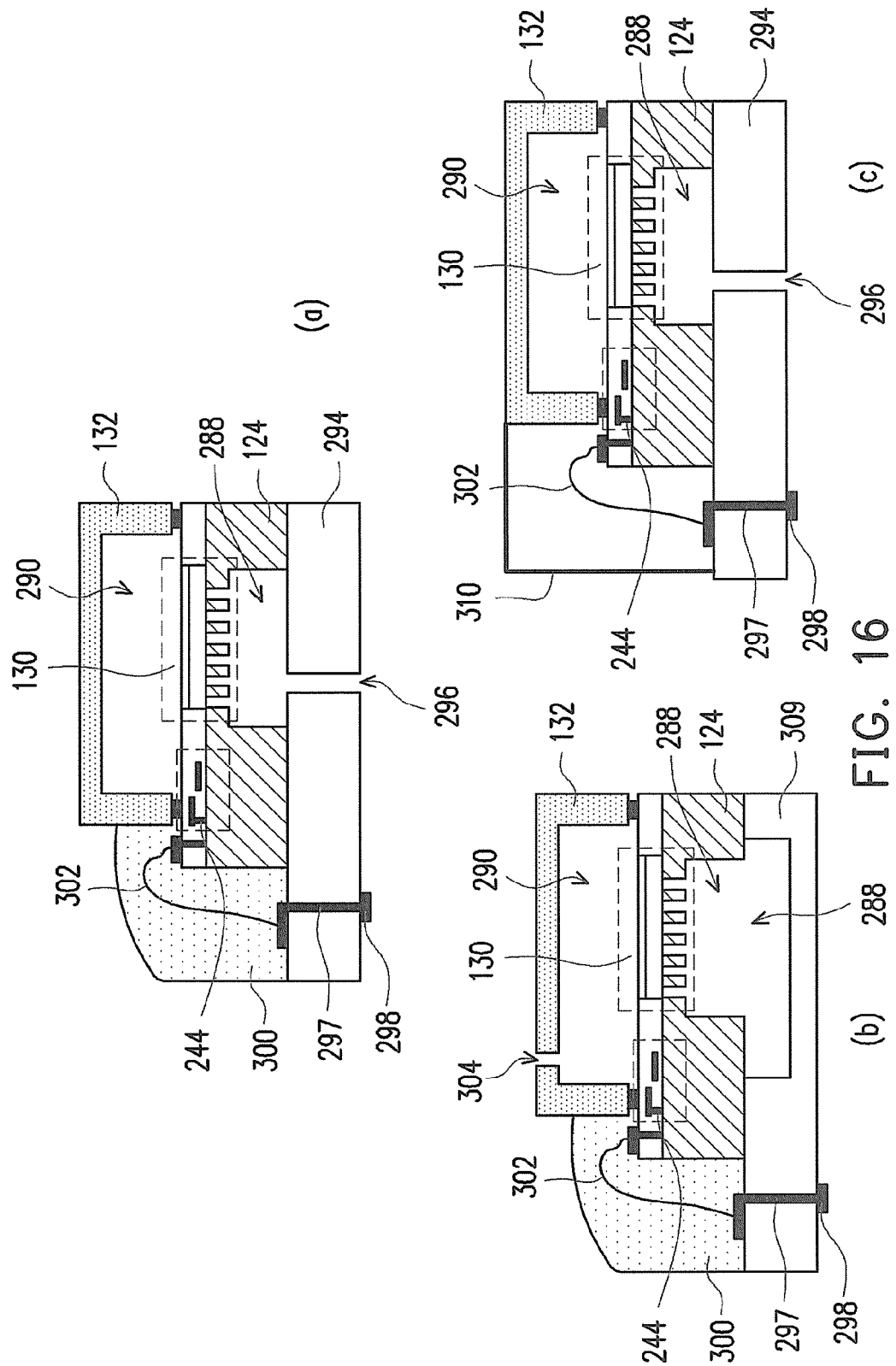

In FIG. 16, other embodiments are further shown. In FIG. 16(a), the packaging structure can be further included. The substrate 294 is formed one the substrate 124 to form the chamber 288, which is coupled to the environment by the aperture 296. The substrate 294 also has the interconnection structure with via 297 and conductive pad 298. The interconnection structure in the substrate 294 can be connected to the integrated circuit 244 by the bonding wire 302. The molding compound 300 can be formed to seal the bonding structure. In FIG. 16(b), as previously described, the chamber 288 and the chamber 290 can be adjusted in volume, in which the aperture 304 allows the chamber 290 to be coupled to the environment. In FIG. 16(c), the molding compound 300 can be replaced with a cover 310. The chamber 288 can be connected to the environment by the aperture 296 in the substrate 294.

Figure 17:
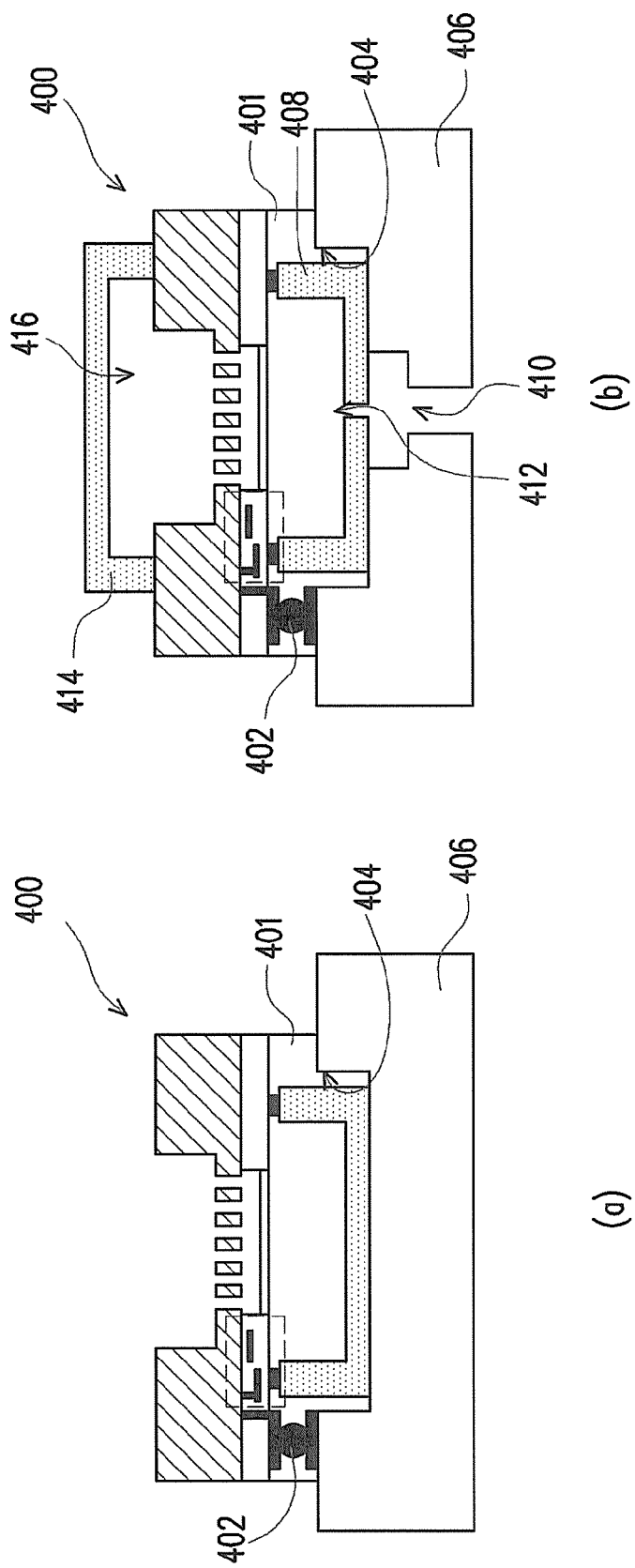

In FIG. 17, the applications of FIG. 14 used in circuit substrate are shown. In FIG. 17(a), the MEMS device 400 is coupled to the circuit substrate 406 by the bonding structure 402 like Flip chip application. The substrate 406 has the indent region 404 to adapt the cover 408 of the MEMS device 400 without adding the thickness. A filling material is filled in the gap between the MEMS device 400, the circuit substrate 406 and a cap and seals the bonding structure 402. In FIG. 17(b), the additional cover 414 can be formed to fully seal the chamber 416. The aperture 412 of the cover 408 and the aperture 410 of the substrate 406 allow the front chamber to couple to the environment. However, the substrate 406 can, for example, further have the subs indent region in coupled with the aperture 412. A filling material 401 is filled in the gap between the MEMS device 400, the circuit substrate 406 and a cap and seals the bonding structure 402.

Figure 18:
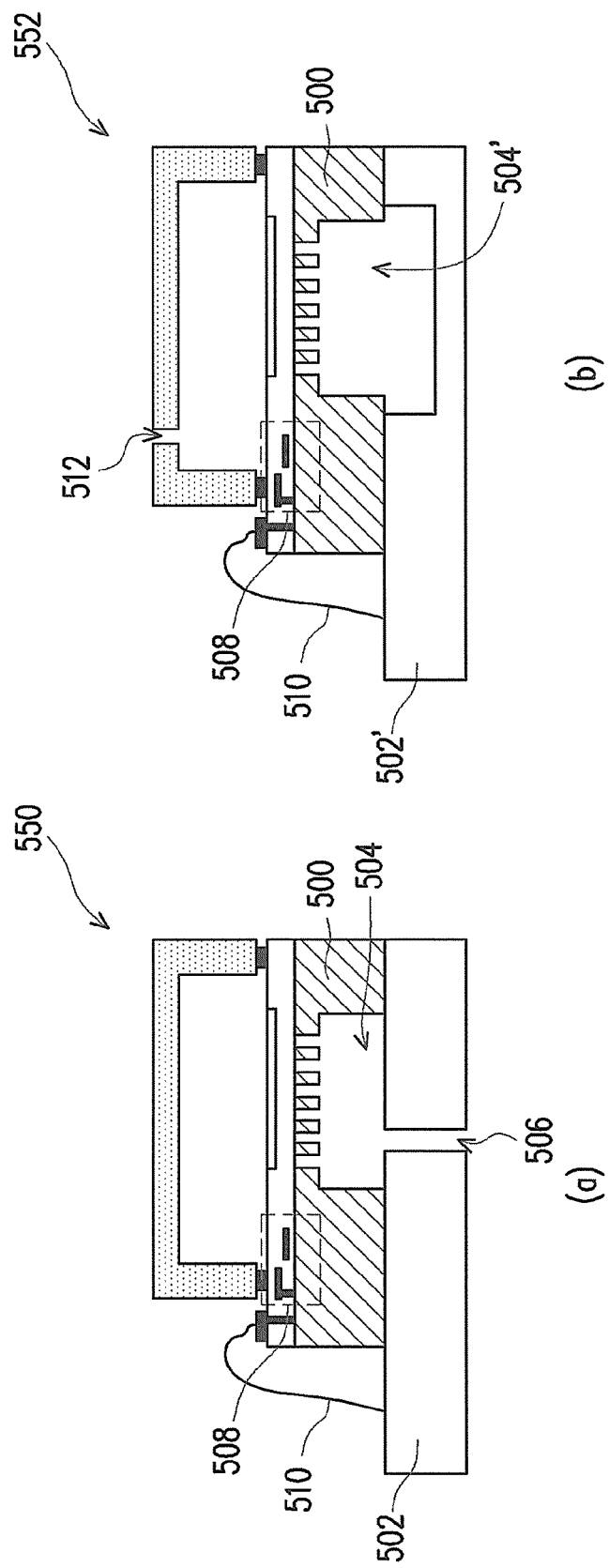

In FIG. 18, the applications of FIG. 14 used in user's PCB are further shown. In FIG. 18(a), the MEMS package 550 is mounted on the circuit board 502. The MEMS device 550 includes the substrate 500 having the chamber 504 and the integrated circuit 508, which is connected to the circuit board 502 by, for example, the bonding wire 510 from the I/O terminal of the integrated circuit 508. The chamber 504 is coupled to the environment through the aperture 506 in the circuit board 502. In FIG. 18(b), depending on the operation direction, the MEMS microphone device 552 is also mounted on the circuit board 502'. However, the aperture 512 is in the cover for receiving acoustic signal from the upper side of the circuit board 502'. In this situation, the chamber 504' is sealed by the circuit board 502' as a back chamber in operation. However, in order to have larger volume of the back chamber 504', the circuit board 502' has the indent region to expand the chamber 504'.

Figure 19:
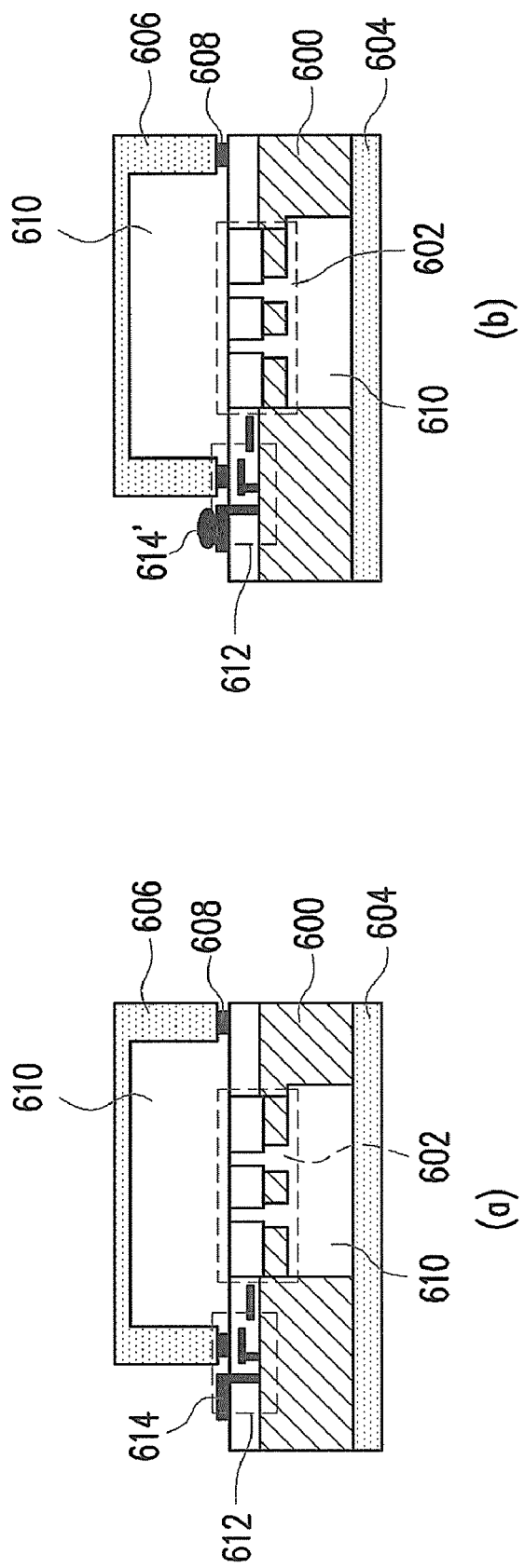

In FIG. 19, other embodiments are further shown. In FIG. 19(a), in other applications not for microphone, the MEMS device does not need to receive the acoustic signal. For example, the MEMS device is used to detect inertial force, and then the structural substrate 600 has the sensing element 602 as the mass source in response to inertial force, for example, acceleration. The integrated circuit 612 has the I/O pad 614, which is exposed without being covered by the cover 606. The cover 606 covers the sensing element to have the upper chamber 610. At the other side of the structural substrate 600, another cover layer 604 covers over the lower chamber 610. The both upper and lower chambers 610 do not couple to the environment. In FIG. 19(b), the bounding structure 614' such as metal bump can be further formed on the I/O pad 614 by the technology of stud bumping or B-stage conductive epoxy. The hermetic package in FIG. 19 can be used in other MEMS device in which the hermetic package is needed, e.g. RF MEMS or MEMS actuator.

It should be noted that all the provided embodiments can be properly combined to each other to have other embodiments.

From the fabrication method, in order to protect the MEMS device, serving as the transducer, from being damaged during packaging process and dicing into singulated chip, the fabrication needs special consideration. FIGS. 20-37 are cross-sectional views, schematically illustrating various fabrication processes for the MEMS device, according to embodiments of the invention.

In FIG. 20A, the fabrication process includes forming several MEMS microphone units 1002 in continuous structure on the same structural substrate 1000. The integrated circuit for each MEMS microphone unit is also formed. The fabrication is based on semiconductor fabrication technology. In FIG. 20B, after the MEMS microphone units are accomplished, the MEMS microphone units are disposed on a supporting layer 1004. In this situation the first chamber of the MEMS microphone unit is covered by the supporting layer 1004. The metal bump 1008 for later use can be formed beforehand by using the technology of stud bumping for example. It should be noted that the supporting layer 1004 is, for example, used for fabrication in supporting and protection and not used as a part of the MEMS device. In FIG. 20C, in order to fabricate the other substrate as described in previous structure embodiments, the adhesive material 1006 are, for example, formed on the structural substrate 1000, e.g. conductive or nonconductive epoxy.

Figure 21A:
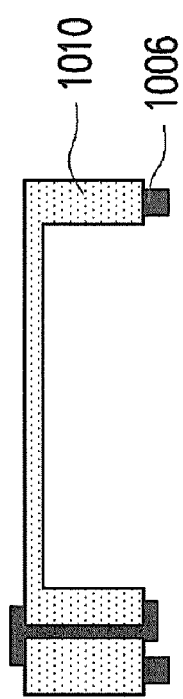
Figure 21B:
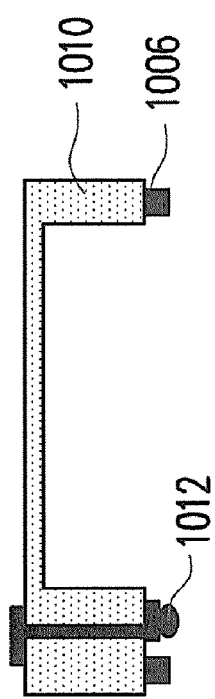
Figure 21C:
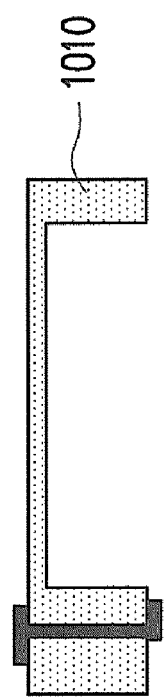

In FIG. 21A, the cover structure 1010 with the interconnection structure can be formed in separate units. However, the adhesive material 1006 can also be formed on the cover structure 1010 instead on the structural substrate 1000. In FIG. 21B, the metal bump or conductive paste 1012 may also formed on the metal pad of the interconnection structure by using the technology of stud bumping, conductive paste (B-stage conductive epoxy). In FIG. 21C, the cover structure 1010 with the interconnection structure can be formed in separate units without adhesive material and bonding structure.

Figure 22A:
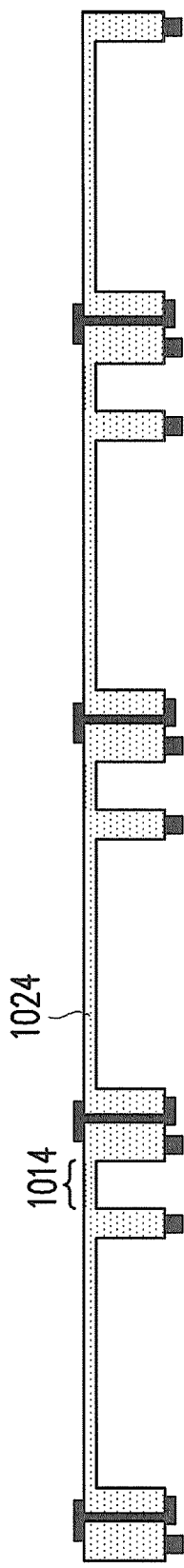
Figure 22B:
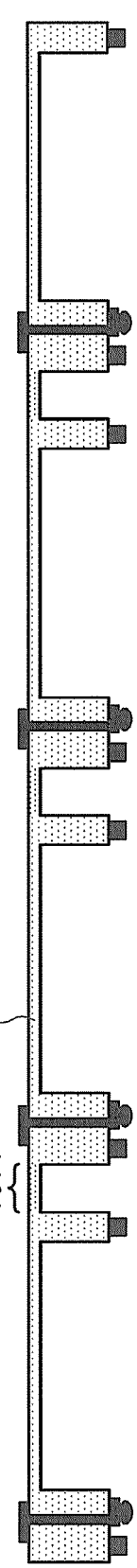
Figure 22C:
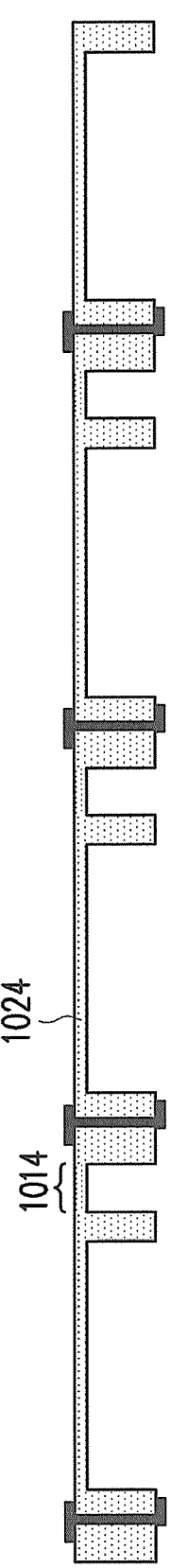

Alternatively, in FIG. 22A, the cover structures 1010 can be formed together at the same substrate 1024. In the situation, there is a substrate portion 1014 between the cover structures 1010 for mechanical joining. However, the adhesive material 1006 can also be formed on the cover structure 1010 instead on the structural substrate 1000. In FIG. 22B, likewise, the metal bump or conductive paste can also be formed on the metal pad of the interconnection structure by using the technology of stud bumping or B-stage conductive epoxy. In FIG. 22C, the cover structures 1010 with interconnection structure can be formed together at the same substrate 1024 without metal bump and adhesive material. This is depending one the actual arrangement.

In FIG. 23A, for the combination of MEMS units and cover structures, e.g. FIGS. 20A-21B, FIGS. 20B-21A, FIGS. 20C-21C or FIGS. 20B-21B, several MEMS units 1020 are formed over the structural substrate 1000 of the MEMS device by the adhesive material. In FIG. 23B, for the combination of the substrate 1024 of MEMS units and continuous cover structures, e.g. FIGS. 20A-22B, FIGS. 20B-22A, FIGS. 20C-22C or FIGS. 20B-22B. For example, if the continuous structure in FIGS. 22A-22B is taken, then the joined MEMS units 1020' are formed on the structural substrate 1000. The electrical coupling between microphone units and covering units using metal bump or conductive paste.

Figure 24C:
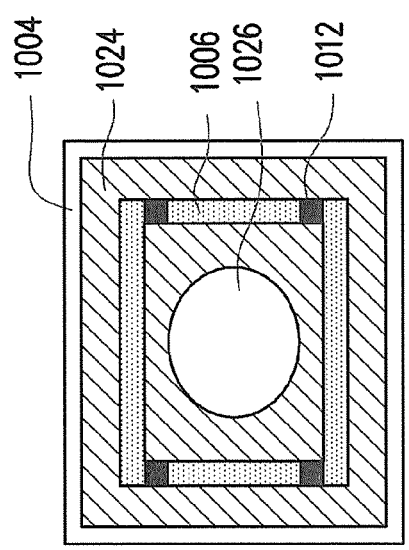
Figure 24B:
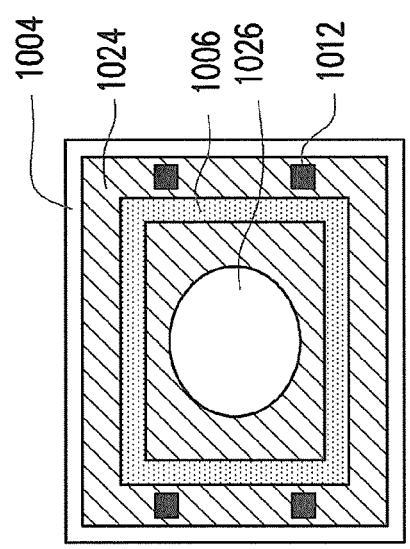
Figure 24A:
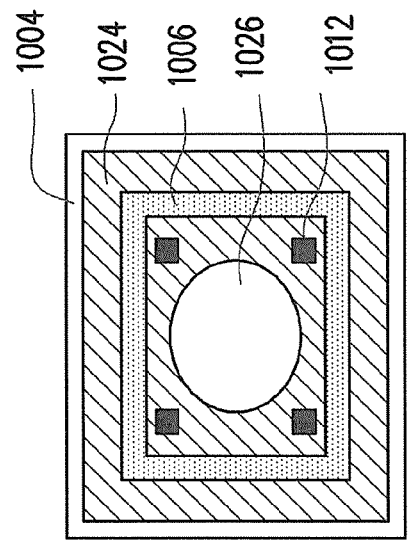

In FIGS. 24A-24C, the top views are shown. In FIG. 24A, the adhesive material 1006 is surrounding the MEMS chamber 1026. The bonding structure on I/O metal pads 1012 is located within the adhesive material 1006. However, in FIG. 24B, the bonding structure on I/O metal pads 1012 can be located outside the adhesive material 1006. The advantage of FIG. 24B is that if the metal bump is used in the electrical connection, the filling material is able to fill in the gap between MEMS units and cover structure and seals the metal bump to increase the reliability of package. Moreover, the adhesive material can protect the MEMS from damage by such liquid filling material, for example.

Even further, the bonding structure on metal pads 1012 can be formed with the adhesive material 1006 as shown in FIG. 24C for example. The bonding structure includes a conductive paste, e.g. B-stage conductive epoxy.

In FIG. 25A, the continuous structural substrate with several MEMS units 1020 is subjected to a dicing process 1032 on the gap between the MEMS units 1020. For the MEMS device, the supporting layer 1004 can protect the MEMS microphone device from, for example, water jet in dicing. Usually, in good protection, the supporting layer 1004 can be the porous layer, so that the chamber can still interact with the environment. In FIG. 25B, if the supporting material 1004 is not porous, an aperture 1034 may be formed over the first chamber of MEMS microphone device so that the supporting layer can be a covering layer of first chamber after singulation.

In FIG. 26A, for another continuous substrate, the MEMS device units 1020' are joined. The dicing process 1032 is performed to first dice the substrate portion and then the MEMS substrate. In FIG. 26B, likewise, the supporting layer 1004 has the aperture 1034.

In FIG. 27A, the separate MEMS device units 1020 are the structure having a covering layer with a plurality of apertures deposed on the substrate of MEMS units. Such the apertures on the substrate of MEMS units are over the first chambers of MEMS units. In this structure, the supporting layer 1036 can also be used. The dicing process 1032 is then performed. In FIG. 28B, the MEMS device units 1020 are in continuous structure before dicing. The dicing process 1032 then dices the substrate portion first and then the MEMS substrate.

Figure 28A:
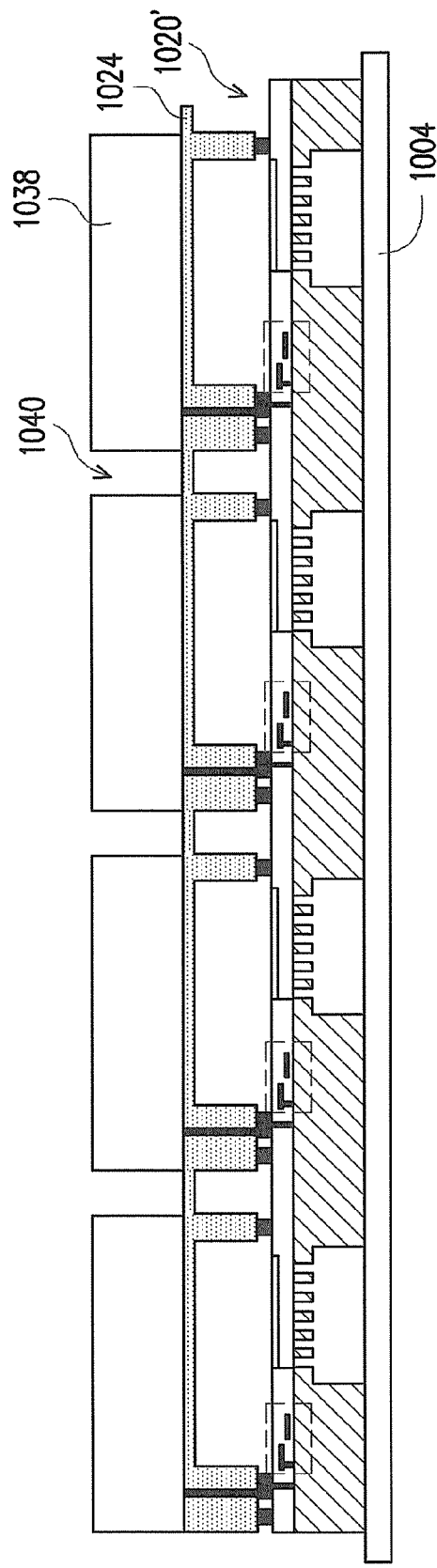
Figure 28B:
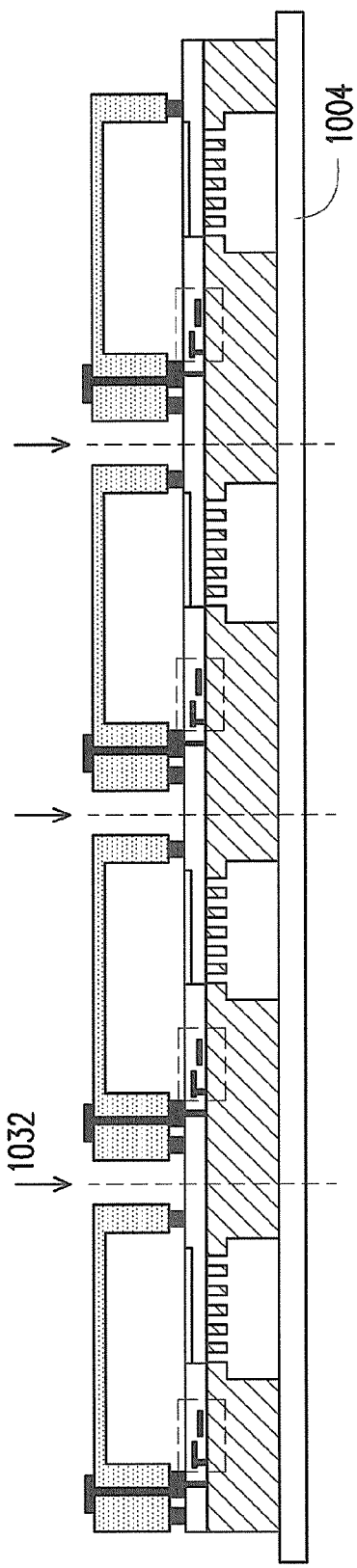

Alternatively, in FIG. 28A, before performing dicing process, the photoresist layer 1038 can be formed on the substrate 1024 and has an opening 1040 top expose the substrate 1024 at the joining portion. Then, the etching process can be performed to remove the exposed portion of the substrate 1024. In FIG. 28B, after etching process and striping the photoresist layer 1038, the dicing process 1032 is performed.

In FIG. 29A, for another structure of the MEMS device with the substrate 1042, it has the aperture 1044 for coupling the chamber to the environment. The supporting layer 1004 can also be used to support the MEMS units. In FIG. 30B, the MEMS units can also be continuous by the substrate 1042'.

Figure 30A:
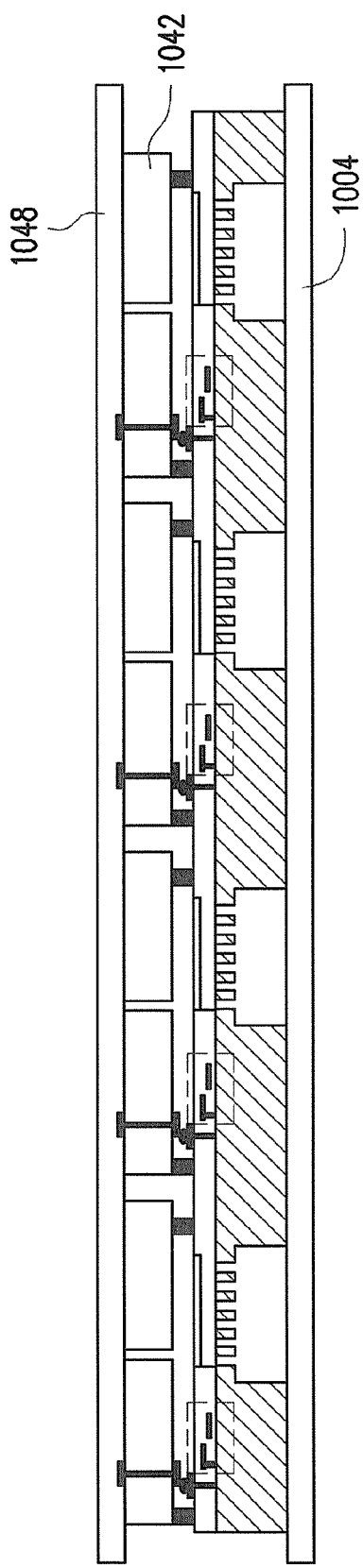
Figure 30B:
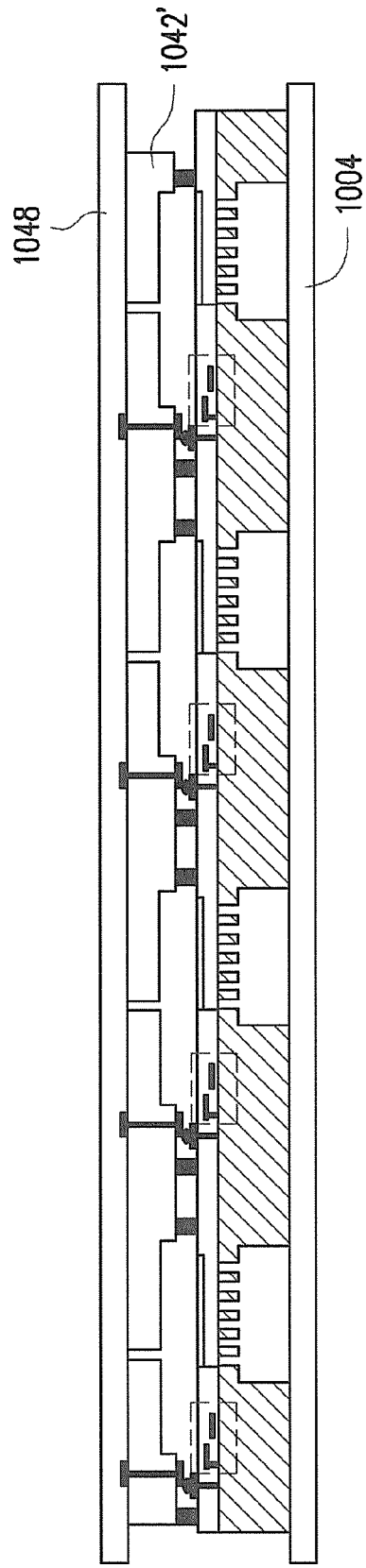

In FIG. 30A and FIG. 30B, another supporting layer 1048 can be formed over the substrate 1042 or the substrate 1042'. The supporting layer 1048 can also protect the aperture 1044 in dicing process. In FIG. 31A and FIG. 31B, the dicing process is performed to singulate the MEMS chips.

In FIG. 32A, the MEMS device unit is the structure with the I/O pad being exposed. However, the supporting layer 1004 can also be used to support the separate MEMS device units with the covers 1015, subjected to dicing process. In FIG. 33B, for the continuous MEMS device units by the substrate 1024, a dual-stage dicing process can also be performed. A first dicing process is to cut the joining portion of the substrate 1024, and then another dicing process is to singulate the MEMS device units into chips.

In FIG. 33, alternatively, the photoresist layer 1052 can be formed with the opening 1054 to expose the joining portion. In FIG. 34, after the joining portion of the substrate is etched and the photoresist layer 1052 is stripped, the dicing process 1056 is performed.

Figure 35:
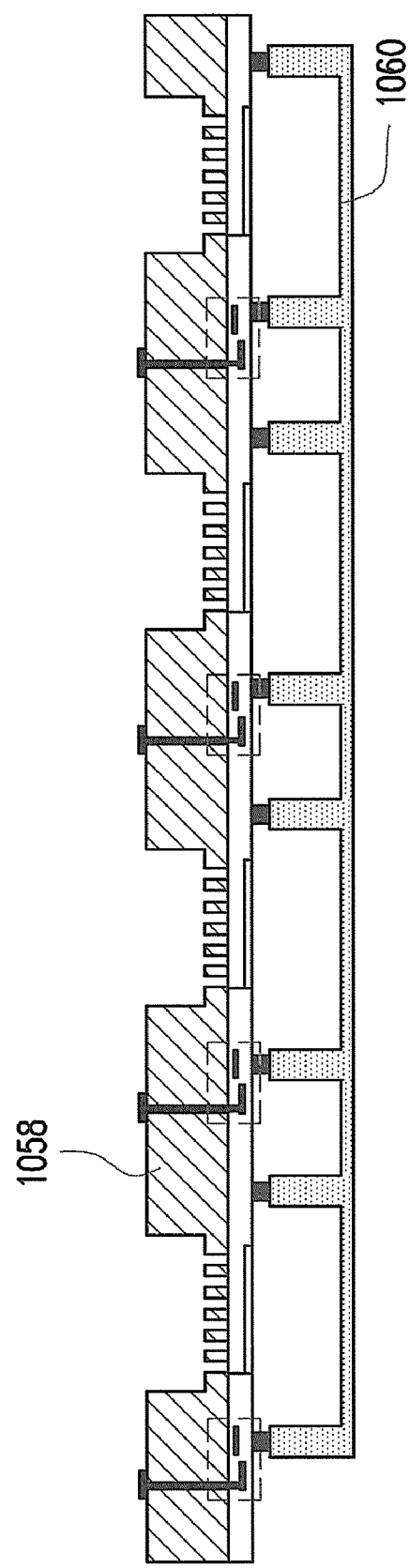

For stacking the second substrate and the third substrate as described in various structures, there are several manners. In FIG. 35, the substrate 1058 is adhered with the cover substrate 1060. In FIG. 36A, the substrate 1062 is adhered to the substrate 1058. The substrate 1062 has the aperture 1064 for coupling the front chamber to the environment. However, there is a gap 1066 between the MEMS device units. In FIG. 36B, for another structure, the substrate 1062 can be continuous without the gap 1066 in FIG. 37A.

In FIG. 37A, since the cover substrate is continuous, the supporting layer 1068 is used to protect the chamber that has the aperture 1064 in FIG. 36A. The dual-stage dicing process of dicing process 1072 is performed and the dicing process 1070 is performed. In FIG. 37B, it is corresponding the structure in FIG. 36B for the continuous cover substrate.

Generally, the supporting layer for the MEMS device is essential because the chamber with the diaphragm should be protected from the dicing process, such as water jet, or from vacuum on the backside of MEMS devices during the wafer level stud bumping.

It will be apparent to those skilled in the art that various modifications and variations can be made to the structure of the invention without departing from the scope or spirit of the invention. In view of the foregoing descriptions, it is intended that the invention covers modifications and variations of this invention if they fall within the scope of the following claims and their equivalents.

What is claimed is:

1. A method for forming a micro-electro-mechanical systems (MEMS) package, comprising:

forming a plurality of MEMS units on a substrate, wherein each of the MEMS units comprises at least one MEMS sensing element and a first chamber over the at least one MEMS sensing element, wherein the MEMS units include electric connection pads;

forming a plurality of covering units correspondingly over the MEMS units, wherein each of the covering units provides a second chamber over the at least one MEMS sensing element opposite to the first chamber, wherein each of the covering units has an interconnection structure to electrically couple to a corresponding one of the MEMS units;

adhering the covering units to the MEMS units by an adhesive material; and dicing the MEMS units into singulated units.

2. The method of claim 1, wherein the at least one MEMS sensing element includes a MEMS microphone structure, wherein the first chamber formed in the substrate has an opening opposite to the at least one MEMS sensing element, and the first chamber is coupled to environment acoustically via the opening.

3. The method of claim 1, wherein the covering units include an adhesive material on the surface of the covering units facing the MEMS units.

4. The method of claim 3, wherein the adhesive material includes conductive material or conductive epoxy.

5. The method of claim 1, wherein the interconnection structure includes a conductive paste.

6. The method of claim 5, wherein the conductive paste is B-stage conductive epoxy or solder paste.

7. The method of claim 5, wherein the adhesive material and the conductive paste are formed as a bonding structure in a ring to surround the at least one MEMS sensing element.

8. The method of claim 1, wherein the interconnection structure includes a metal bump.

9. The method of claim 8, wherein the metal bump is a stud bump.

10. The method of claim 1, wherein the MEMS units include a metal bump on the connection pad.

11. The method of claim 10, wherein the metal bump is a stud bump.

12. The method of claim 1, wherein the covering units are formed on the substrate in joining together as a portion of the substrate.

13. The method of claim 1, further comprising forming the adhesive materials as a plurality of rings on the substrate to surround the MEMS sensing elements, the covering units being adhered to the substrate by the adhesive materials.

14. A method for forming a micro-electro-mechanical systems (MEMS) package, comprising:
   forming a plurality of MEMS units on a substrate, wherein each of the MEMS units comprises at least one MEMS sensing element and a first chamber over the at least one MEMS sensing element, wherein the MEMS units include electric connection pads;
   forming a plurality of covering units correspondingly over the MEMS units, wherein each of the covering units provides a second chamber over the at least one MEMS sensing element opposite to the first chamber;
   forming an adhesive material as a ring to surround the at least one MEMS sensing element and further forming a bonding structure at outside of the ring;
   adhering the covering units to the MEMS units by an adhesive material; and
   dicing the MEMS units into singulated units.

15. A method for forming a micro-electro-mechanical systems (MEMS) package, comprising:
   forming a plurality of MEMS units on a substrate, wherein each of the MEMS units comprises at least one MEMS sensing element and a first chamber over the at least one MEMS sensing element, wherein the MEMS units include electric connection pads;
   forming a plurality of covering units correspondingly over the MEMS units, wherein each of the covering units provides a second chamber over the at least one MEMS sensing element opposite to the first chamber, wherein each of the covering units has an interconnection structure to electrically couple to a corresponding one of the MEMS units;
   adhering the covering units to the MEMS units by an adhesive material; and
   dicing the MEMS units into singulated units,
   wherein the covering units are formed on a continuous substrate with a joining portion, and the step of dicing the MEMS units comprises:
   removing the joining portion by etching or preliminary dicing; and
   dicing the continuous substrate of the MEMS units.

16. The method of claim 1, before dicing the MEMS units, further comprising forming a supporting layer under the substrate of the MEMS units covering the first chamber to protect the at least one MEMS sensing element from water jet during dicing.

17. The method of claim 16, before dicing the MEMS units, further comprising forming a protection layer over the covering units at an opposite side to the supporting layer to protect the at least one MEMS sensing element from water jet during dicing.

18. A method for forming a micro-electro-mechanical systems (MEMS) package, comprising:
   forming a plurality of MEMS units on a substrate, wherein each of the MEMS units comprises at least one MEMS sensing element and a first chamber over the at least one MEMS sensing element, wherein the MEMS units include electric connection pads;
   forming a plurality of covering units correspondingly over the MEMS units, wherein each of the covering units provides a second chamber over the at least one MEMS sensing element opposite to the first chamber, wherein each of the covering units has an interconnection structure to electrically couple to a corresponding one of the MEMS units;
   adhering the covering units to the MEMS units by an adhesive material; and
   dicing the MEMS units into singulated units,
   wherein the covering units are formed by a print circuit board, a silicon substrate, or a ceramic substrate.

* * * * *